United States Patent
Lung et al.

(10) Patent No.: US 9,672,906 B2
(45) Date of Patent: Jun. 6, 2017

(54) PHASE CHANGE MEMORY WITH INTER-GRANULAR SWITCHING

(71) Applicant: MACRONIX INTERNATIONAL CO., LTD., Hsinchu (TW)

(72) Inventors: Hsiang-Lan Lung, Ardsley, NY (US); Yung-Han Ho, Taipei (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 15/074,202

(22) Filed: Mar. 18, 2016

(65) Prior Publication Data

US 2016/0372188 A1    Dec. 22, 2016

Related U.S. Application Data

(60) Provisional application No. 62/181,909, filed on Jun. 19, 2015.

(51) Int. Cl.
| | |
|---|---|
| *G11C 11/16* | (2006.01) |
| *G11C 11/15* | (2006.01) |
| *G11C 13/00* | (2006.01) |
| *H01L 45/00* | (2006.01) |

(52) U.S. Cl.
CPC ...... *G11C 13/0004* (2013.01); *G11C 13/0069* (2013.01); *H01L 45/06* (2013.01); *H01L 45/1233* (2013.01); *H01L 45/1246* (2013.01); *H01L 45/144* (2013.01); *H01L 45/1625* (2013.01); *G11C 2013/0073* (2013.01)

(58) Field of Classification Search
USPC .................................. 365/163, 158
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 3,846,767 A | 11/1974 | Cohen | |
| 4,177,475 A | 12/1979 | Holmberg | |
| 4,452,592 A | 6/1984 | Tsai | |
| 4,599,705 A | 7/1986 | Holmberg et al. | |
| 4,719,594 A | 1/1988 | Young et al. | |

(Continued)

FOREIGN PATENT DOCUMENTS

| | | |
|---|---|---|
| CN | 102298964 A | 12/2011 |
| TW | 201231684 A | 8/2012 |

(Continued)

OTHER PUBLICATIONS

"Magnetic Bit Boost," www.sciencenews.org, Dec. 18 & 25, 2004, p. 389, vol. 166.

(Continued)

*Primary Examiner* — Hoai V Ho
*Assistant Examiner* — Minh Dinh
(74) *Attorney, Agent, or Firm* — Haynes Beffel & Wolfeld LLP

(57) ABSTRACT

A memory device comprising a conglomerate material interposed between a first electrode and a second electrode is provided. The conglomerate material includes nanocrystalline grains embedded in an amorphous matrix. During operations, phase change reactions occur at the inter-grain boundaries in the conglomerate material so as to reduce the operation power.

18 Claims, 19 Drawing Sheets

(56) References Cited

U.S. PATENT DOCUMENTS

| | | |
|---|---|---|
| 4,769,339 A | 9/1988 | Ishii |
| 4,876,220 A | 10/1989 | Mohsen et al. |
| 4,959,812 A | 9/1990 | Momodomi et al. |
| 5,106,775 A | 4/1992 | Kaga et al. |
| 5,166,096 A | 11/1992 | Cote et al. |
| 5,166,758 A | 11/1992 | Ovshinsky et al. |
| 5,177,567 A | 1/1993 | Klersy et al. |
| 5,332,923 A | 7/1994 | Takeuchi |
| 5,341,328 A | 8/1994 | Ovshinsky et al. |
| 5,391,901 A | 2/1995 | Tanabe |
| 5,515,488 A | 5/1996 | Hoppe et al. |
| 5,534,712 A | 7/1996 | Ovshinsky et al. |
| 5,550,396 A | 8/1996 | Tsutsumi |
| 5,596,522 A | 1/1997 | Ovshinsky et al. |
| 5,687,112 A | 11/1997 | Ovshinsky |
| 5,688,713 A | 11/1997 | Linliu et al. |
| 5,716,883 A | 2/1998 | Tseng |
| 5,754,472 A | 5/1998 | Sim |
| 5,789,277 A | 8/1998 | Zahorik et al. |
| 5,789,758 A | 8/1998 | Reinberg |
| 5,814,527 A | 9/1998 | Wolstenholme et al. |
| 5,825,046 A | 10/1998 | Czubatyj et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,033,535 A | 3/2000 | Ohno et al. |
| 6,034,882 A | 3/2000 | Johnson et al. |
| 6,046,951 A | 4/2000 | El Hajji |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,088,269 A | 7/2000 | Lambertson |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,143,636 A | 11/2000 | Forbes et al. |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,687,307 B1 | 2/2004 | Anikhindi et al. |
| 6,744,088 B1 | 6/2004 | Dennison |
| 6,750,079 B2 | 6/2004 | Lowrey et al. |
| 6,750,101 B2 | 6/2004 | Lung |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,805,563 B2 | 10/2004 | Ohashi |
| 6,809,401 B2 | 10/2004 | Nishihara et al. |
| 6,815,704 B1 | 11/2004 | Chen |
| 6,838,692 B1 | 1/2005 | Lung |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,881,603 B2 | 4/2005 | Lai |
| 6,885,021 B2 | 4/2005 | Apodaca et al. |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,927,411 B2 | 8/2005 | Kozicki |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,956,261 B2 | 10/2005 | Shibata |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg |
| 6,992,932 B2 | 1/2006 | Cohen |

(56) References Cited

U.S. PATENT DOCUMENTS

| | | |
|---|---|---|
| 6,998,289 B2 | 2/2006 | Hudgens et al. |
| 7,023,008 B1 | 4/2006 | Happ |
| 7,023,009 B2 | 4/2006 | Kostylev et al. |
| 7,033,856 B2 | 4/2006 | Lung |
| 7,038,230 B2 | 5/2006 | Chen et al. |
| 7,038,938 B2 | 5/2006 | Kang |
| 7,042,001 B2 | 5/2006 | Kim et al. |
| 7,042,760 B2 | 5/2006 | Hwang et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung |
| 7,208,751 B2 | 4/2007 | Ooishi |
| 7,214,958 B2 | 5/2007 | Happ |
| 7,220,983 B2 | 5/2007 | Lung |
| 7,229,883 B2 | 6/2007 | Wang et al. |
| 7,238,959 B2 | 7/2007 | Chen |
| 7,238,994 B2 | 7/2007 | Chen et al. |
| 7,248,494 B2 | 7/2007 | Oh et al. |
| 7,251,157 B2 | 7/2007 | Osada et al. |
| 7,253,429 B2 | 8/2007 | Klersy et al. |
| 7,254,059 B2 | 8/2007 | Li et al. |
| 7,262,502 B2 | 8/2007 | Chang |
| 7,265,373 B2 | 9/2007 | Wang et al. |
| 7,269,052 B2 | 9/2007 | Segal et al. |
| 7,274,586 B2 | 9/2007 | Choi et al. |
| 7,277,317 B2 | 10/2007 | Le Phan |
| 7,291,556 B2 | 11/2007 | Choi et al. |
| 7,309,630 B2 | 12/2007 | Fan et al. |
| 7,314,776 B2 | 1/2008 | Johnson et al. |
| 7,317,201 B2 | 1/2008 | Gutsche et al. |
| 7,321,130 B2 | 1/2008 | Lung et al. |
| 7,323,708 B2 | 1/2008 | Lee et al. |
| 7,323,734 B2 | 1/2008 | Ha et al. |
| 7,332,370 B2 | 2/2008 | Chang et al. |
| 7,336,526 B2 | 2/2008 | Osada et al. |
| 7,351,648 B2 | 4/2008 | Furukawa et al. |
| 7,355,238 B2 | 4/2008 | Takata et al. |
| 7,359,231 B2 | 4/2008 | Venkataraman et al. |
| 7,364,935 B2 | 4/2008 | Lung |
| 7,365,355 B2 | 4/2008 | Parkinson |
| 7,365,385 B2 | 4/2008 | Abbott |
| 7,379,328 B2 | 5/2008 | Osada et al. |
| 7,385,235 B2 | 6/2008 | Lung |
| 7,388,273 B2 | 6/2008 | Burr et al. |
| 7,394,088 B2 | 7/2008 | Lung |
| 7,397,060 B2 | 7/2008 | Lung |
| 7,400,522 B2 | 7/2008 | Toda et al. |
| 7,423,300 B2 | 9/2008 | Lung et al. |
| 7,426,134 B2 | 9/2008 | Happ et al. |
| 7,440,308 B2 | 10/2008 | Jeong et al. |
| 7,449,710 B2 | 11/2008 | Lung |
| 7,453,081 B2 | 11/2008 | Happ et al. |
| 7,473,576 B2 | 1/2009 | Lung |
| 7,479,649 B2 | 1/2009 | Lung |
| 7,485,891 B2 | 2/2009 | Hamann et al. |
| 7,488,968 B2 | 2/2009 | Lee |
| 7,501,648 B2 | 3/2009 | Chen et al. |
| 7,502,252 B2 | 3/2009 | Fuji et al. |
| 7,507,986 B2 | 3/2009 | Lung |
| 7,514,334 B2 | 4/2009 | Chen et al. |
| 7,514,705 B2 | 4/2009 | Breitwisch et al. |
| 7,515,461 B2 | 4/2009 | Happ et al. |
| 7,569,844 B2 | 8/2009 | Lung |
| 7,679,163 B2 | 3/2010 | Chen et al. |
| 7,683,360 B2 | 3/2010 | Chen et al. |
| 7,688,619 B2 | 3/2010 | Lung et al. |
| 7,696,503 B2 | 4/2010 | Lung et al. |
| 7,701,759 B2 | 4/2010 | Lung et al. |
| 7,718,989 B2 | 5/2010 | Lai et al. |
| 7,728,319 B2 | 6/2010 | Goux et al. |
| 7,745,807 B2 | 6/2010 | Chen et al. |
| 7,759,770 B2 | 7/2010 | Happ et al. |
| 7,800,159 B2 | 9/2010 | Widjaja et al. |
| 7,800,943 B2 | 9/2010 | Ravasio et al. |
| 7,863,594 B2 | 1/2011 | Akinaga et al. |
| 7,867,804 B2 | 1/2011 | Lee |
| 7,868,313 B2 | 1/2011 | Breitwisch et al. |
| 7,875,873 B2 | 1/2011 | Chen et al. |
| 7,893,419 B2 | 2/2011 | Hudgens et al. |
| 7,893,420 B2 | 2/2011 | Liang et al. |
| 7,913,215 B2 | 3/2011 | Chou et al. |
| 7,978,508 B2 | 7/2011 | Czubatyj |
| 8,124,950 B2 | 2/2012 | Happ et al. |
| 8,138,028 B2 | 3/2012 | Lung et al. |
| 8,324,605 B2 | 12/2012 | Lung et al. |
| 8,363,463 B2 | 1/2013 | Shih et al. |
| 8,809,829 B2 | 8/2014 | Lee |
| 8,946,666 B2 | 2/2015 | Cheng et al. |
| 9,337,421 B2* | 5/2016 | Chin ............... H01L 45/06 |
| 2002/0017701 A1 | 2/2002 | Klersy et al. |
| 2002/0070457 A1 | 6/2002 | Sun et al. |
| 2002/0113273 A1 | 8/2002 | Hwang et al. |
| 2002/0168852 A1 | 11/2002 | Harshfield et al. |
| 2003/0002331 A1 | 1/2003 | Park et al. |
| 2003/0072195 A1 | 4/2003 | Mikolajick |
| 2003/0095426 A1 | 5/2003 | Hush et al. |
| 2003/0116794 A1 | 6/2003 | Lowrey |
| 2003/0186481 A1 | 10/2003 | Lung |
| 2004/0026686 A1 | 2/2004 | Lung |
| 2004/0051094 A1 | 3/2004 | Ooishi |
| 2004/0109351 A1 | 6/2004 | Morimoto et al. |
| 2004/0113137 A1 | 6/2004 | Lowrey |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0052904 A1 | 3/2005 | Cho et al. |
| 2005/0062087 A1 | 3/2005 | Chen et al. |
| 2005/0093022 A1 | 5/2005 | Lung |
| 2005/0127349 A1 | 6/2005 | Horak et al. |
| 2005/0141261 A1 | 6/2005 | Ahn |
| 2005/0145984 A1 | 7/2005 | Chen et al. |
| 2005/0167656 A1 | 8/2005 | Sun et al. |
| 2005/0191804 A1 | 9/2005 | Lai et al. |
| 2005/0195633 A1 | 9/2005 | Choi et al. |
| 2005/0201182 A1 | 9/2005 | Osada et al. |
| 2005/0212024 A1 | 9/2005 | Happ |
| 2005/0212026 A1 | 9/2005 | Chung et al. |
| 2005/0215009 A1 | 9/2005 | Cho |
| 2005/0263829 A1 | 12/2005 | Song et al. |
| 2006/0006472 A1 | 1/2006 | Jiang |
| 2006/0018156 A1 | 1/2006 | Happ |
| 2006/0038221 A1 | 2/2006 | Lee et al. |
| 2006/0046509 A1 | 3/2006 | Gwan-Hyeob |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0105556 A1 | 5/2006 | Matsui et al. |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113520 A1 | 6/2006 | Yamamoto et al. |
| 2006/0113521 A1 | 6/2006 | Lung |
| 2006/0118853 A1 | 6/2006 | Takata et al. |
| 2006/0118913 A1 | 6/2006 | Yi et al. |
| 2006/0121391 A1 | 6/2006 | Khang et al. |

(56) References Cited

U.S. PATENT DOCUMENTS

| | | |
|---|---|---|
| 2006/0124916 A1 | 6/2006 | Lung |
| 2006/0126395 A1 | 6/2006 | Chen et al. |
| 2006/0126423 A1 | 6/2006 | Aratani et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0163554 A1 | 7/2006 | Lankhorst et al. |
| 2006/0169968 A1 | 8/2006 | Happ |
| 2006/0172067 A1 | 8/2006 | Ovshinsky et al. |
| 2006/0175599 A1 | 8/2006 | Happ |
| 2006/0192193 A1 | 8/2006 | Lee et al. |
| 2006/0198183 A1 | 9/2006 | Kawahara et al. |
| 2006/0202245 A1 | 9/2006 | Zuliani et al. |
| 2006/0205108 A1 | 9/2006 | Maimon et al. |
| 2006/0211165 A1 | 9/2006 | Hwang et al. |
| 2006/0226409 A1 | 10/2006 | Burr et al. |
| 2006/0231169 A1 | 10/2006 | Park et al. |
| 2006/0234138 A1 | 10/2006 | Fehlhaber et al. |
| 2006/0237756 A1 | 10/2006 | Park et al. |
| 2006/0245236 A1 | 11/2006 | Zaidi |
| 2006/0249369 A1 | 11/2006 | Marangon et al. |
| 2006/0250885 A1 | 11/2006 | Cho et al. |
| 2006/0261392 A1 | 11/2006 | Lee et al. |
| 2006/0266993 A1 | 11/2006 | Suh et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289847 A1 | 12/2006 | Dodge |
| 2006/0289848 A1 | 12/2006 | Dennison |
| 2007/0007613 A1 | 1/2007 | Wang et al. |
| 2007/0008786 A1 | 1/2007 | Scheuerlein |
| 2007/0029606 A1 | 2/2007 | Noh et al. |
| 2007/0030721 A1 | 2/2007 | Segal et al. |
| 2007/0037101 A1 | 2/2007 | Morioka |
| 2007/0040159 A1 | 2/2007 | Wang |
| 2007/0047296 A1 | 3/2007 | Philipp et al. |
| 2007/0051936 A1 | 3/2007 | Pellizzer et al. |
| 2007/0096162 A1 | 5/2007 | Happ et al. |
| 2007/0096248 A1 | 5/2007 | Philipp et al. |
| 2007/0097739 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0120104 A1 | 5/2007 | Ahn et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0138458 A1 | 6/2007 | Lung |
| 2007/0147105 A1 | 6/2007 | Lung et al. |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0156949 A1 | 7/2007 | Rudelic et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0170881 A1 | 7/2007 | Noh et al. |
| 2007/0171705 A1 | 7/2007 | Parkinson |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0189065 A1 | 8/2007 | Suh et al. |
| 2007/0201267 A1 | 8/2007 | Happ et al. |
| 2007/0215852 A1 | 9/2007 | Lung |
| 2007/0221906 A1 | 9/2007 | Hideki et al. |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1 | 11/2007 | Arnold et al. |
| 2007/0257300 A1 | 11/2007 | Ho et al. |
| 2007/0262388 A1 | 11/2007 | Ho et al. |
| 2007/0267618 A1 | 11/2007 | Zaidi et al. |
| 2007/0267620 A1 | 11/2007 | Happ |
| 2007/0267721 A1 | 11/2007 | Kuh et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0017842 A1 | 1/2008 | Happ et al. |
| 2008/0025089 A1 | 1/2008 | Scheuerlein et al. |
| 2008/0035907 A1 | 2/2008 | Czubatyj et al. |
| 2008/0042119 A1 | 2/2008 | Sandoval et al. |
| 2008/0043520 A1 | 2/2008 | Chen |
| 2008/0048167 A1 | 2/2008 | Kostylev et al. |
| 2008/0075844 A1 | 3/2008 | Ha et al. |
| 2008/0094871 A1 | 4/2008 | Parkinson |
| 2008/0101110 A1 | 5/2008 | Happ et al. |
| 2008/0106923 A1 | 5/2008 | Lung |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0151613 A1 | 6/2008 | Chao et al. |
| 2008/0157053 A1 | 7/2008 | Lai et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0253166 A1 | 10/2008 | Raberg et al. |
| 2008/0265234 A1 | 10/2008 | Lung |
| 2008/0272807 A1 | 11/2008 | Lowrey |
| 2008/0303014 A1 | 12/2008 | Goux et al. |
| 2008/0310208 A1 | 12/2008 | Daley |
| 2009/0001341 A1 | 1/2009 | Breitwisch et al. |
| 2009/0008636 A1 | 1/2009 | Lee |
| 2009/0014704 A1 | 1/2009 | Chen et al. |
| 2009/0014705 A1 | 1/2009 | Hsu et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0072215 A1 | 3/2009 | Lung et al. |
| 2009/0078924 A1 | 3/2009 | Liang et al. |
| 2009/0098678 A1 | 4/2009 | Lung |
| 2009/0166603 A1 | 7/2009 | Lung |
| 2009/0194759 A1 | 8/2009 | Chin et al. |
| 2009/0196089 A1 | 8/2009 | Kang et al. |
| 2009/0226603 A1 | 9/2009 | Lowrey |
| 2009/0230375 A1 | 9/2009 | Liang et al. |
| 2009/0250678 A1 | 10/2009 | Osano et al. |
| 2009/0268507 A1 | 10/2009 | Breitwisch et al. |
| 2009/0289242 A1 | 11/2009 | Breitwisch et al. |
| 2009/0294748 A1 | 12/2009 | Breitwisch et al. |
| 2010/0038614 A1 | 2/2010 | Hampton |
| 2010/0044665 A1 | 2/2010 | Jedema |

(56) References Cited

U.S. PATENT DOCUMENTS

| | | | |
|---|---|---|---|
| 2010/0051895 | A1 | 3/2010 | Hampton |
| 2010/0054029 | A1 | 3/2010 | Happ et al. |
| 2010/0055829 | A1 | 3/2010 | Im et al. |
| 2010/0055830 | A1 | 3/2010 | Chen et al. |
| 2010/0084624 | A1 | 4/2010 | Lung et al. |
| 2010/0144128 | A1 | 6/2010 | Lung et al. |
| 2010/0151652 | A1 | 6/2010 | Lung et al. |
| 2010/0157665 | A1 | 6/2010 | Lung et al. |
| 2010/0193763 | A1 | 8/2010 | Chen et al. |
| 2010/0244023 | A1 | 9/2010 | Parkinnson |
| 2010/0270529 | A1 | 10/2010 | Lung |
| 2010/0291747 | A1 | 11/2010 | Lung et al. |
| 2010/0328995 | A1 | 12/2010 | Shih et al. |
| 2010/0328996 | A1 | 12/2010 | Shih et al. |
| 2011/0013446 | A1 | 1/2011 | Lung |
| 2011/0034003 | A1 | 2/2011 | Lung |
| 2011/0049456 | A1 | 3/2011 | Lung et al. |
| 2011/0084240 | A1 | 4/2011 | Schell et al. |
| 2011/0110018 | A1 | 5/2011 | Ishii et al. |
| 2011/0207284 | A1 | 8/2011 | Tominaga et al. |
| 2011/0234362 | A1 | 9/2011 | Koehler et al. |
| 2011/0317480 | A1 | 12/2011 | Lung et al. |
| 2012/0181499 | A1 | 7/2012 | Chuang et al. |
| 2012/0225504 | A1 | 9/2012 | Hong et al. |
| 2013/0277638 | A1* | 10/2013 | Moradpour ............. H01L 45/04 257/4 |
| 2015/0048291 | A1 | 2/2015 | Cheng et al. |
| 2015/0280119 | A1 | 10/2015 | Hsu et al. |

FOREIGN PATENT DOCUMENTS

| | | |
|---|---|---|
| TW | I476973 B | 3/2015 |
| WO | 0079539 A1 | 12/2000 |
| WO | 0145108 A1 | 6/2001 |
| WO | 0225733 A2 | 3/2002 |
| WO | 2004025659 A1 | 3/2004 |

OTHER PUBLICATIONS

"New Memories Tap Spin, Gird for Battle," Science News, Apr. 3, 1999, p. 223, vol. 155.
"Optimized Thermal Capacitance in a Phase Change Memory Cell Design," IPCOM000141986D, IP.com Prior Art Database, Oct. 18, 2006, 4pp.
"Remembering on the Cheap," www.sciencenews.org, Mar. 19, 2005, p. 189, vol. 167.
"Thermal Conductivity of Crystalline Dielectrics" in CRC Handbook of Chemistry and Physics, Internet Version 2007, (87th edition), David R. Lide, ed. Taylor and Francis, Boca Raton, Fl, Jun. 15, 2006, 2pp.
Adler, D. et al., "Threshold Switching in Chalcogenide-Glass Thin Films," J. Appl/Phys 51(6), Jun. 1980, pp. 3289-3309.
Adler, David, "Amorphous-Semiconductor Devices," Sci. Amer., vol. 236, pp. 36-48, May 1977.
Ahn, S. J. et al., "A Highly Manufacturable High Density Phase Change Memory of 64 Mb and Beyond," IEEE IEDM Dec. 13-15, 2004, pp. 907-910.
Ahn, S. J. et al., "Highly Reliable 5nm Contact Cell Technology for 256Mb PRAM," VLSI Technology, Digest of Technical Papers, Jun. 14-16, 2005, pp. 98-99.
Atwood, G, et al., "90 nm Phase Change Technology with u Trench and Lance Cell Elements," VLSI Technology, Systems and Applications, Apr. 23-25, 2007, pp. 1-2.
Axon Technologies Corporation paper: Technology Description, published at least as early as Dec. 1997, pp. 1-6.
Bedeschi, F. et al., "4-MB MOSFET-Selected Phase-Change Memory Experimental Chip," IEEE, Sep. 21 to 23, 2004, 4 PP.
Blake thesis, "Investigation of GeTeSb5 Chalcogenide Films for Use as an Analog Memory," AFIT/GE/ENG/00M-04, Mar. 2000, 121 pages.

Burr, et al., "Experimental demonstration and tolerancing of a large-scale neural network (165,000 synapses), using phase-change memory as the synaptic weight element," IEEE IEDM 2014, Dec. 15-17, 2014, pp. 29.5.1-29.5.4.
Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.
Chen, An et al., "Non-Volatile Resistive Switching for Advanced Memory Applications," IEEE IEDM, Dec. 5-7, 2005, 4 pp.
Cheng, H-Y et al., "The Crystallization Behavior of Ge1SbxTe1 Phase-Change Materials," unpublished presentation materials, 2010 MRS Spring Meeting, Apr. 5-8, 2010, 30 pp.
Cho, et al., "Highly Scalable On-axis Confined Cell Structure for High Density PRAM beyond 256Mb," Jun. 14-16, 2005 Symposium on VLSI Technology Digest of Technical Papers, pp. 96-97.
Czubatyj, Wally, et al., "Current Reduction in Ovonic Memory Devices," USA E*PCOS06 2006, May 29-31, 2006, 10 pages.
Gibson, et al., "Phase-change Recording Medium that Enables Ultrahigh-density Electron-beam Data Storage," Applied Physics Letters 86, Jan. 25, 2005, 3 pages.
Gill, Manzur et al., "A High-Performance Nonvolatile Memory Technology for Stand-Alone Memory and Embedded Applications," Feb. 3-7, 2002 IEEE-ISSCC Technical Digest (TD 12.4), 7 pp.
Gleixner, "Phase Change Memory Reliability", 22nd NVSMW, Aug. 26, 2007, 46 pages.
Ha, Y. H. et al., "An Edge Contact Type Cell for Phase Change RAM Featuring Very Low Power Consumption," Jun. 10-12, 2003 Symposium on VLSI Technology Digest of Technical Papers, pp. 175-176.
Hanzawa,et al., "A 512kB Embedded Phase Change Memory with 416kB/s Write Throughput at 100mA Cell Write Current," 2007 Solid-State Circuits Conf., ISSCC 2007 Digest of Technical Papers, Feb. 11-15, 2007, 3 pages.
Happ, et al., "Novel One-Mask Self-Heating Pillar Phase Change Memory," 2006 Symposium on VLSI Technology, Jun. 13-15, 2006, 2 pages.
Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.
Hegedus, J., "Microscopic origin of the fast crystallization ability of Ge—Sb—Te phase-change memory materials," Dept. of Chemistry, University of Cambridge, published online Mar. 23, 2008, 7 pages.
Horii, H. et al., "A Novel Cell Technology Using N-doped GeSbTe Films for Phase Change RAM," Jun. 10-12, 2003 Symposium on VLSI Technology Digest of Technical Papers, pp. 177-178.
Hudgens, S. et al., "Overview of Phase-Change Chalcogenide Nonvolatile Memory Technology," MRS Bulletin, Nov. 2004, pp. 829-832.
Hwang, Y. N. et al., "Full Integration and Reliability Evaluation of Phase-change RAM Based on 0.24um-CMOS Technologies," Jun. 10-12, 2003 Symposium on VLSI Technology Digest of Technical Papers, pp. 173-174.
Iwasaki, Hiroko et al., "Completely Erasable Phase Change Optical Disk," Jpn. J. Appl. Phys., Feb. 1992, pp. 461-465, vol. 31.
Jameson, et al., "Conductive-bridge memory (CBRAM) with excellent high-temperature retention," IEEE IEDM 2013, Dec. 9-11, 2013, pp. 30.1.1-30.1.4.
Jeong, C. W. et al., "Switching Current Scaling and Reliability Evaluation in PRAM," IEEE Non-Volatile Semiconductor Memory Workshop, Monterey, CA 2004, Aug. 22-26, 2004, pp. 28-29 and workshop cover sheet.
Kang, et al., "PRAM cell technology and characterization in 20nm node size," in IEEE IEDM 2011, Dec. 5-7, 2011, pp. 3.1.1-3.1.4.
Kao, et al. "Electrical Characteristics of Ga3Te2Sb12 with High Thermal Stability for PRAM," 3rd Int'l NanoElec. Conf (INEC), Jan. 2010, pp. 698-699.
Kim, Kinam et al., "Reliability Investigations for Manufacturable High Density PRAM," IEEE 43rd Annual International Reliability Physics Symposium, San Jose, Apr. 17-21, 2005, pp. 157-162.

(56) References Cited

OTHER PUBLICATIONS

Kojima, R. et al., "Acceleration of Crystallization Speed by Sn Addition to Ge—Sb—Te Phase-Change Recording Material," Jpn. J. Appl. Phys., vol. 40, Part 1, No. 10, Oct. 2001, pp. 5930-5937.

Kojima, Rie et al., "Ge—Sn—Sb—Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM Dec. 13-15, 2004, 4 pp.

Lai, Stefan, "Current Status of the Phase Change Memory and Its Future," IEEE IEDM Dec. 10, 2003, pp. 255-258.

Lai, Stephan et al., "OUM—A 180 nm Nonvolatile Memory Cell Element Technology for Stand Alone and Embedded Applications," IEEE IEDM Dec. 2-5, 2001, pp. 803-806.

Lam, C.H., "Phase Change Memory and its intended applications," IEEE IEDM 2014, Dec. 15-17, 2014, pp. 29.3.1-29.3.4.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Lee, Tae-Yon, et al., "Separate domain formation in Ge2Sb2Te5-Siox mixed layer," Appl. Phys. Lett. 89, 163503, Oct. 16, 2006, 3 pages.

Li, Yiming, "Temperature dependence on the contact size of GeSbTe films for phase change memories," J. Comput Electron, Jan. 23, 2008, 7:138-141.

Lin, Y.Y., et al., "Nano-crystalline phase change memory with composite Si—Sb—Te film for better data retention and lower operation current," 22nd IEEE Non-Volatile Semiconductor Memory Workshop, Aug. 26-30, 2007, 61-62.

Lung, et al., "Towards the integration of both ROM and RAM functions phase change memory cells on a single die for system-on-chip (SOC) applications," 2014 Symp. on VLSI Technology, Digest of Technical Papers, Jun. 9-12, 2014, pp. 1-2.

Matsuzaki et al., "Oxygen-doped GeSbTe Phase-change Memory Cells Featuring 1.5-V/100-.mu.A Standard 0.13-.mu.m CMOS Operations," IEDM Tech. Digest, vol. 758, Dec. 5-7, 2005, 4pp.

Morales-Sanchez, "Structural, electric and kinetic parameters of ternary alloys of GeSbTe," Thin Solid Films, vol. 471, Jan. 3, 2005, pp. 243-247.

Morikawa, T., et al., "Doped In—Ge—Te Phase Change Memory Featuring Stable Operation and Good Data Retention," IEEE IEDM Dec. 10-12, 2007, 307-10.

Mott, Nevill, "Electrons in Glass," Nobel Lecture, Physics, 1977, Dec. 8, 1977, pp. 403-413.

Noh, Jin-Seo, et al., "Modification of Ge2Sb2Te5 by the Addition of SiOx for Improved Operation of Phase Change Random Access Memory," Mater. Res. Soc. Symp. Proc. vol. 888-V05-09.1, Nov. 20, 2006, 6 pages.

Oh, et al., "Enhanced Write Performance of a 64Mb Phase-Change Random Access Memory," IEEE J. Of Solid State Circuits, ISSCC 2006, vol. 41, Issue 1, Jan. 2006, 3 pages.

Okuda et al., "Explosive Crystallization Mechanism in Sb-rich Eutectic Materials of Phase Change Optical Memory," Mater. Res. Soc. Proc. vol. 803, Jan. 2003, 7pp.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," Jun. 15-17, 2004 Symposium on VLSI Technology Digest of Technical Papers, pp. 18-19.

Pirovano, Agostino et al.,"Reliability Study of Phase-Change Non-volatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Qiao, Baowei, et al., "Si—Sb—Te films for phase-change random access memory," Semicond. Sci. Technol. 21 (Jun. 28, 2006) 1073-1076.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE Jun. 4-7, 2002, pp. 237-240.

Ryu, Seung Wook, et al., "SiO2 Incorporation Effects in Ge2Sb2Te5 Films Prepared by Magnetron Sputtering for Phase Change Random Access Memory Devices," Electrochemical and Solid-State Letters, 9 (8) G259-G261, May 23, 2006.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Shih et al., "Understanding Amorphous States of Phase-Change Memory Using Frenkel-Poole Model," IEDM Tech. Digest, vol. 207, Dec. 7-9, 2009, pp. 31.7.1-31.7.4.

Strauss, Karl F. et al., "Overview of Radiation Tolerant Unlimited Write Cycle Non-Volatile Memory," IEEE Mar. 18-25, 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Van Pieterson, et al., "Phase-change recording materials with a growth-dominated crystallization mechanism: A materials overview," J. Appl. Phys. vol. 97:083520, Apr. 6, 2005, 7pp.

Villa et al., "A 45nm 1Gb 1.8V phase-change memory," Solid-State Circuits Conference Digest of Technical Papers (ISSCC), 14.8, Feb. 2010, pp. 270-271.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wolf, Stanley, Excerpt from: Silicon Processing for the VLSI Era—vol. 4, pp. 674-679, Dec. 1, 2002.

Wuttig, Matthias, "Towards a Universal Memory?" Nature Materials, Apr. 2005, pp. 265-266, vol. 4.

Yi, et al., "Novel Cell Structure of PRAM with Thin Metal Layer Inserted GeSbTe," IEEE IEDM Dec. 8-10, 2003, 4 pages.

Yamada et al., "Rapid-phase transitions of Ge Te—Sb2 Te3 pseudobinary amorphous thin films for an optical disk memory," J. Appl. Phys. 69(5), Mar. 1991, pp. 2849-2856.

Yamada, N. et al., "High Speed Overwritable Phase Change Optical Disk Material," Proc. Int. Symp. on Optical Memory, Tokyo, Jpn. J. Appl. Phys., vol. 26, (Jan. 1987) Supplement 26-4, pp. 61-66.

Yamada, Noboru, "Potential of Ge—Sb—Te phase-change optical disks for high-data-rate recording in the near future," (Conference Proceedings Paper), Jul. 30, 1997, vol. 3109, 10 pages.

Yonehara, T. et al., "Control of Grain Boundary Location by Selective Nucleation Over Amorphous Substrates," Mat. Res. Soc. Symp. Proc., vol. 106, Fall 1987, pp. 21-26.

Chen, et al., "Endurance Improvement of Ge2Sb2Te5-Based Phase Change Memory," IEEE Int'l Memory Workshop, 2009, May 10-14, 2009, 2 pages.

Cheng et al., "A thermally robust phase change memory by engineering the Ge/N concentration in (Ge, N)xSbyTe z phase change materiaL" 2012 Int'l IEEE IEDM, Dec. 10-13, 2012, 4 pages.

Cheng et al., "The Crystallization Behavior of Ga—Sb Materials as a Function of Composition for Phase Change Random Access Memory," Phase Change and Ovonics Symposium, Sep. 2011, 7 pages.

(56) References Cited

OTHER PUBLICATIONS

Cheng et al., Ga46Sb54 Material for Fast Switching and Pb-Free Soldering Reflow Process Complying Phase-Change Memory, ECS J. Solid State Sci. Technol. 2014 vol. 3, issue 7, Jun. 2014, p. 263-p. 267.

Cheng, et al., "A high performance phase change memory with fast switching speed and high temperature retention by engineering the GexSbyTez phase change material," 2011 IEEE Int'l IEDM, Dec. 5-7, 2011, 4 pages.

Cheng, H.Y., et al., "Atomic-level engineering of phase change material for novel fast-switching and high-endurance PCM for storage class memory application," IEEE Int'l Electron Devices Meeting (IEDM), Dec. 9-11, 2013, pp. 30.6.1,30.6.4.

Ciocchini, N., et al. "Unified reliability modeling of Ge-rich phase change memory for embedded applications" IEEE Int'l Electron Devices Meeting (IEDM), Dec. 9-11, 2013, pp. 22.1.1,22.1.4.

Kim, I.S., et al., "High performance PRAM cell scalable to sub-20nm technology with below 4F2 cell size, extendable to DRAM applications," 2010 Symp. on VLSI Technology, Jun. 15-17, 2010, 2 pages.

Lu et al., Ga14Sb86 film for ultralong data retention phase-change memory, J. Appl. Phys. 109, 064503, Jun. 2011, 4 pages.

Navarro, G., et al., "Trade-off between SET and data retention performance thanks to innovative materials for phase-change memory," IEEE Int'l Electron Devices Meeting (IEDM), Dec. 9-11, 2013, pp. 21.5.1,21.5.4.

Office Action from U.S. Appl. No. 14/936,318 dated Nov. 18, 2016, 7 pages.

Putero et al., Unusual crystallization behavior in Ga—Sb phase change alloys, APL Mat. 1, 062101, Dec. 2013, 7 pages.

Shah et al., "GaSb—Ge pseudobinary phase diagram," Journal of Electronic Materials, vol. 11, Issue 1, Jan. 1982, 53-58.

Wimmer, et al., Role of activation energy in resistance drift of amorphous phase change materials, Frontiers in Physics, Dec. 2014, vol. 2, Article 75, pp. 1-12.

Zuliani, P., et al., "Overcoming Temperature Limitations in Phase Change Memories With Optimized GexSbyTez," IEEE Trans. on Electron Devices, 60(12), Dec. 2013, pp. 4020,4026.

\* cited by examiner

PHASE CHANGE MEMORY WITH INTER-GRANULAR SWITCHING

RELATED APPLICATIONS

This application claims the benefit of U.S. Provisional Patent Application No. 62/181,909 filed on 19 Jun. 2015, which application is incorporated by reference as if fully set forth herein.

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND

Technological Field

The present technology relates to memory devices based on phase change materials, and methods for manufacturing and operating such devices.

Description of Related Art

In a phase change memory (PCM), each memory cell includes a phase change memory element. The phase change memory element can be caused to change phase between a crystalline state and an amorphous state. The amorphous state is characterized by higher electrical resistivity than the crystalline state. In operation of the phase change memory element, an electrical current pulse passed through the phase change memory cell can set or reset the resistivity phase of the phase change memory element. To reset the memory element into the amorphous phase, an electrical current pulse with a large magnitude for a short time period can be used to heat up an active region of the memory element to a melting temperature, and then cool quickly causing it to solidify in the amorphous phase. To set the memory element into the crystalline phase, an electrical current pulse with a medium magnitude, which causes it to heat up to a crystallization transition temperature, and a longer cooling time period can be used allowing the active region to solidify in a crystalline phase. To read the state of the memory element, a small voltage is applied to the selected cell and the resulting electrical current is sensed.

To achieve low power operation, the magnitude of the current needed for reset can be reduced by reducing the size of the phase change material element in the cell and/or the contact area between electrodes and the phase change material, such that higher current densities are achieved with small absolute current values through the phase change material element. As shown in FIG. 1A, a conventional "mushroom-type" memory cell 100 has a reduced contact area between first electrode 111 and phase change memory element 113. First electrode 111 extends through dielectric 112, phase change memory element 113 comprises a body of phase change material, and second electrode 114 resides on the memory element 113. First electrode 111 is coupled to a terminal of an access device (not shown) such as a diode or transistor, while second electrode 114 is coupled to a bit line and can be part of the bit line (now shown). First electrode 111 has a width less than the width of second electrode 114 and memory element 113, establishing a small contact area between the body of phase change material and first electrode 111 and a relatively larger contact area between the body of phase change material and second electrode 114, so that higher current densities are achieved with small absolute current values through memory element 113. Because of this smaller contact area at the first electrode 111, the current density increases in the region adjacent first electrode 111, resulting in the active region 115 having a "mushroom" shape as shown in FIG. 1A. FIG. 1B is a low angle annular dark field scanning transmission electron microscopy (LAADF-STEM) image of a cross-section of a mushroom-type memory cell comprising $Ge_2Sb_2Te_5$ in the reset state. As seen in the FIG. 1B, a bulk amorphous mushroom-shaped region 116 is formed over the bottom electrode and surrounded by large crystalline grains.

For smaller width of electrodes, smaller currents are required for a reset operation. However, forming electrodes of sublithographic feature size involves complicated manufacturing processes, thereby increasing manufacturing costs. Moreover, the electrical and mechanical reliability issues increase with reducing the contact area.

It is desirable to provide memory devices having small reset current yet maintaining electrical and mechanical reliability.

SUMMARY

A memory device having a conglomerate material interposed between a first electrode and a second electrode is described herein. The conglomerate material comprises nanocrystalline grains embedded within an amorphous matrix. The memory device can be operated using inter-granular phase switching. The memory device further comprises circuitry to execute the inter-granular phase switching, wherein the circuitry applies a first bias arrangement to induce formation of amorphous material between the nanocrystalline grains within a region over the first electrode, effective to increase electrical resistance of the conglomerate material between the first and second electrodes above a first threshold without eliminating the nanocrystalline grains in the region, and applies a second bias arrangement to induce expansion of the nanocrystalline grains in the region by an amount effective to decrease electrical resistance of the conglomerate material between the first and second electrodes below a second threshold. The first bias arrangement applied to the memory device is configured to melt the conglomerate material between the nanocrystalline grains and then form the amorphous phase to block the electrical current between the nanocrystalline grains over the first electrode. The second bias arrangement applied to the memory device induces crystallization between the nanocrystalline grains so that the electrical current passes through between the nanocrystalline grains.

A conglomerate material described herein comprises a chalcogenide with an amount of germanium effective to cause the conglomerate material to form the nanocrystalline grains in the amorphous matrix. In another embodiment, the conglomerate material comprises a chalcognide with one or more additives selected from a group including silicon, oxygen, nitrogen and carbon, in an amount or amounts effective to cause the conglomerate material to form the nanocrystalline grains in the amorphous matrix.

The term "nanocrystalline grains" used herein refers to grains having less than 10 nm in minimum dimension.

The term "additive" or "additives" used herein refers to a dopant or an element intentionally added during formation of the conglomerate material.

A method for manufacturing the memory device described herein includes forming a first electrode having an electrode surface; forming a conglomerate material on the electrode surface, the conglomerate material including nanocrystalline grains embedded in an amorphous matrix; and forming a second electrode on the conglomerate material. The conglomerate material is formed using physical vapor deposition techniques. The conglomerate material comprises chalcogenide alloys with an effective amount of germanium to cause the conglomerate material to form the nanocrystalline grains in the amorphous matrix. The conglomerate material also comprises combination of chalcogenide alloys with an effective amount of silicon to cause the conglomerate material to form the nanocrystalline grains in the amorphous matrix.

A method for operating a memory device having a conglomerate material between first and second electrodes is also provided. The conglomerate material includes nanocrystalline grains embedded in an amorphous matrix. To store a first data value, the method includes applying a first bias arrangement to induce formation of amorphous material between the nanocrystalline grains within a region over a first electrode, by an amount effective to increase electrical resistance of the conglomerate material between the first and second electrodes above a first threshold without eliminating the nanocrystalline grains in the region. To store a second data value, the method includes applying a second bias arrangement to induce expansion of the nanocrystalline grains within the region by an amount effective to decrease electrical resistance of the conglomerate material between the first and second electrodes below a second threshold.

Other features, combinations of features, aspects and advantages of the technology described herein can be seen in the drawings, the detailed description and the claims, which follow.

DETAILED DESCRIPTION

A detailed description of embodiments of the technology is provided with reference to the FIGS. 2-19.

Figure 2:
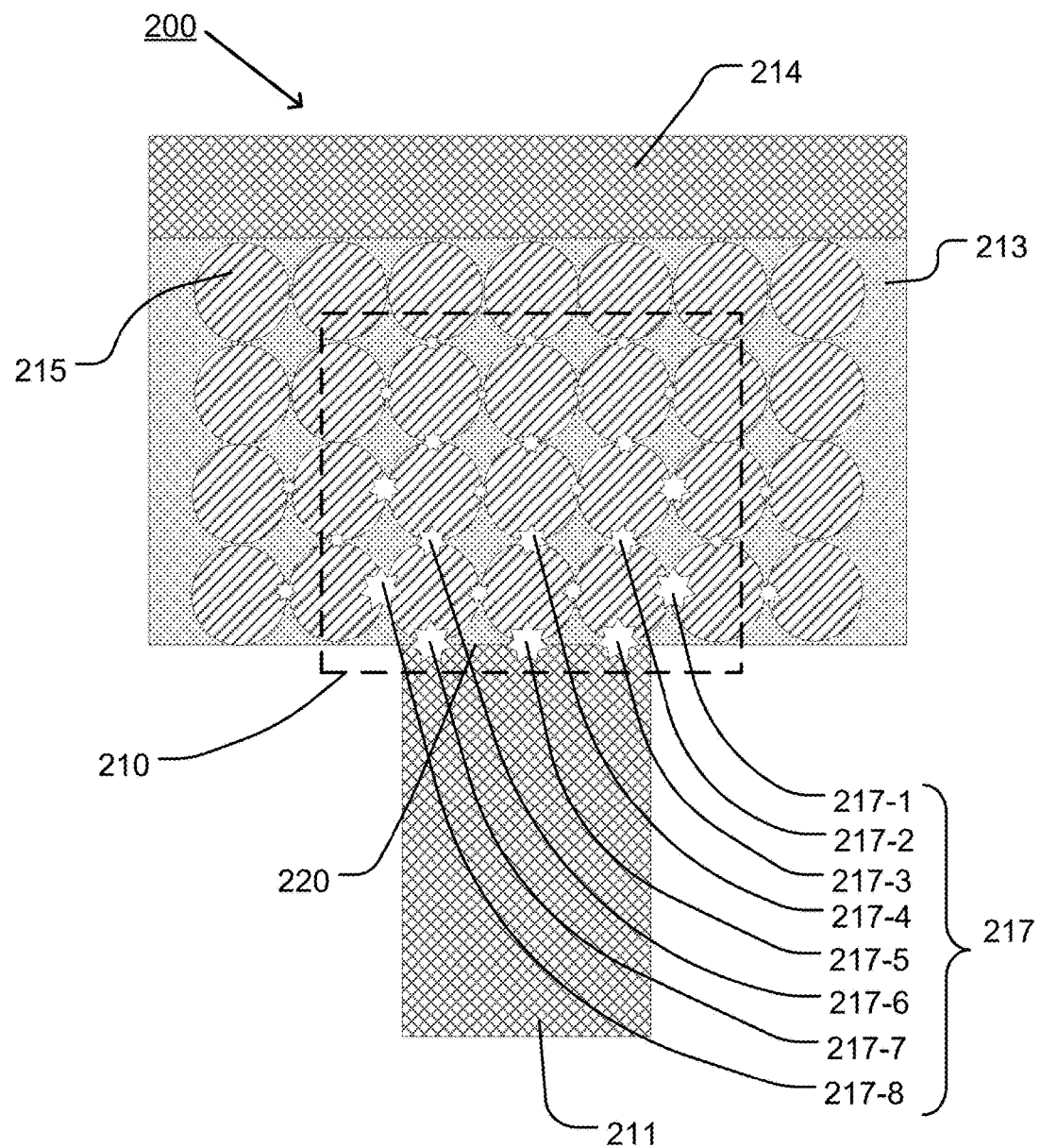
FIG. 2 schematically illustrates a structure of a memory cell with a conglomerate material having nanocrystalline grains as described herein.

FIG. 2 illustrates a memory cell 200 having a conglomerate material including nanocrystalline grains 215 embedded in an amorphous matrix 213. Memory cell 200 includes a first electrode 211 having an electrode surface 220 contacting the conglomerate material, and a second electrode 214 on the conglomerate material. Inter-grain boundaries 217-1, 217-2, . . . and 217-8, collectively indicated 217, are between nanocrystalline grains 215. To simplify the illustration, not all inter-grain boundaries are given their own numeral. The nanocrystalline grains 215 can have a stoichiometry different than the amorphous matrix 213.

First and second electrodes 211 and 214 may comprise, for example, TiN or TaN. Alternatively, the first and second electrodes 211 and 214 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof.

The conglomerate material is the memory element and composed of a phase change material. Nanocrystalline grains 215 and amorphous matrix 213 may both be comprised of a phase change material, and may be comprised of a phase change material in combination with additives, such as Si, N, O, and C in amounts effective to cause formation of the conglomerate structure, or in amounts effective to increase the crystallization transition temperature. Nanocrystalline grains 215 in embodiments described herein can comprise more atoms selected from a group including Ge, Sb, Te, and Ga and lesser atoms of the additives than occur in amorphous matrix 213. The amorphous material in amorphous matrix 213 in embodiments described herein can comprise more additives selected from a group including Si, N, O, and C than occur in the nanocrystalline grains 215. The conglomerate material in embodiments described herein can comprise a chalcogenide with an amount of germanium effective to cause the conglomerate material to form the nanocrystalline grains in the amorphous matrix. The chalcogenide can be $Ge_xSb_yTe_z$, for example $Ge_4Sb_2Te_3$, and $Ge_xSb_yGa_z$ for example $Ge_1Sb_1Te_1$. The conglomerate material in embodiments described herein can comprise a chalcogenide with one or more additives selected from a group including silicon (Si), nitrogen (N), oxygen (O) and carbon (C), in an amount or amounts, for example 1-10 at %, effective to cause the conglomerate material to form the nanocrystalline grains in the amorphous matrix. The chalcogenide with one or more additives can be $Ge_xSb_yTe_zSi_m$, $Ge_xSb_yTe_zSi_mO_n$, $Ge_xSb_yTe_zSi_mN_n$, $Ge_xSb_yTe_z$, $N_m$. In a reset operation, circuitry applies a first bias arrangement to induce formation or expansion of bodies of amorphous material between the nanocrystalline grains 215 within a region 210 over the first electrode surface 220 effective to increase electrical resistance of the conglomerate material between the first and second electrodes 211 and 214 above a first threshold without eliminating the nanocrystalline grains 215 in the region 210. After the first bias arrangement is applied, the amorphous material surrounds the nanocrystalline grains in the region 210. A current crowding effect occurs at inter-grain boundaries 217 over first electrode 211. With a current limiter (not shown), the first bias arrangement is limited to melting the material in inter-grain boundaries 217, and not eliminating nanocrystalline grains 215, resulting in the amorphous phase at inter-grain boundaries 217. The current limiter during the first bias arrangement can be used to limit current flow through the memory element.

In a set operation, a second bias arrangement is applied to memory cell 200 to induce growth or expansion of nanocrystalline grains 215 in the region 210 by an amount effective to decrease electrical resistance of the conglomerate material between the first and second electrodes 211 and 214 below a second threshold. Thus, the crystalline phase is formed at inter-grain boundaries 217, rendering a low resistance state. After the second bias arrangement is applied, the nanocrystalline grains surround the amorphous material in the region 210. During reset and set operations, the phase change reactions generally occur at inter-grain boundaries 217 within the conglomerate material.

Figure 3:
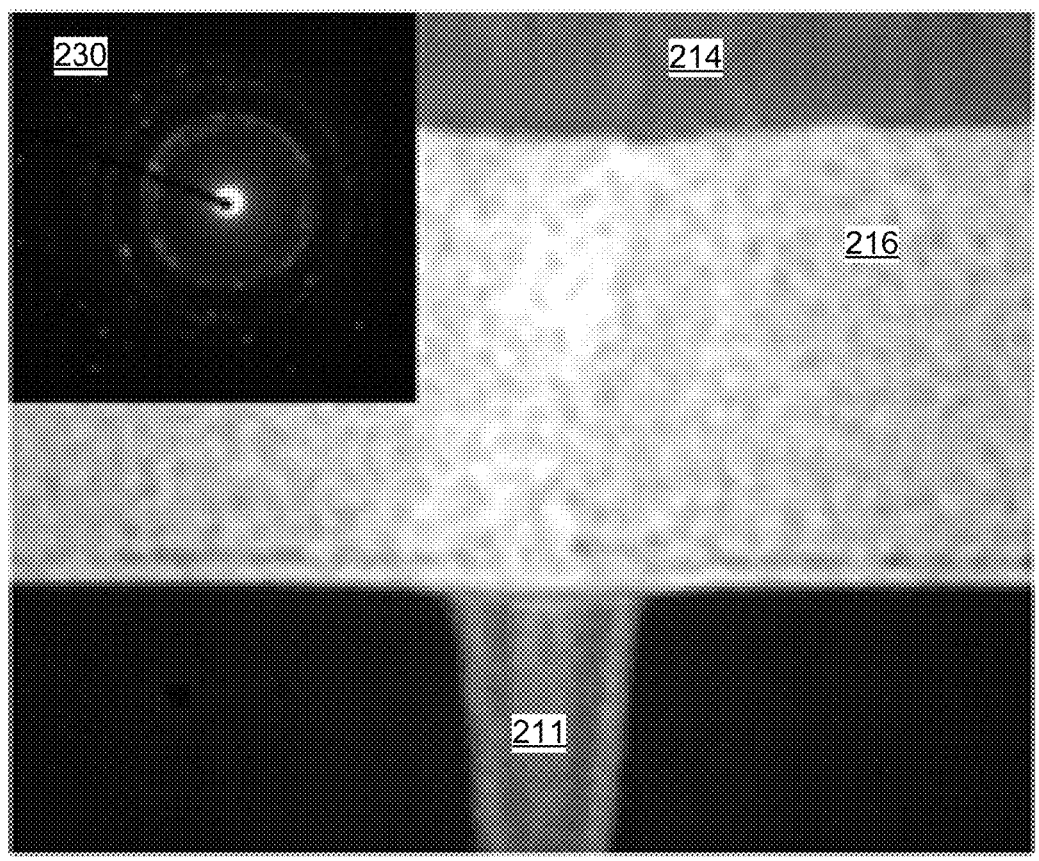
FIG. 3 is a high angle annular dark field scanning transmission electron microscopy (HAADF-STEM) image of a cross-section of a memory cell comprising a conglomerate material having nanocrystalline grains described herein in the reset state.

FIG. 3 illustrates a high angle annular dark field scanning transmission electron microscopy (HAADF-STEM) image of a cross-section of a memory cell comprising a conglomerate material 216 having nanocrystalline grains embedded in the amorphous matrix in the reset state. The inset image 230 in the upper-left corner shows an electron beam diffraction pattern illustrating the coexistence of the crystalline and amorphous phases in conglomerate material 216. The conglomerate material 216 comprises a chalcogenide or a chalcogenide with one or more additives. The white spots indicate the crystalline phase (nanocrystalline grains), and the gray spots indicate the amorphous phase (amorphous matrix). The nanocrystalline grains have more atoms selected from a group including germanium (Ge), antimony (Sb), tellurium (Te), and gallium (Ga), while the amorphous matrix has more additives selected from a group including silicon (Si), oxygen (O), nitrogen (N), and carbon (C). The conglomerate material has a different atomic concentration profile in the crystalline region (nanocrystalline grains) than is found in the amorphous region (amorphous matrix).

The term "stoichiometry" as used here refers to the quantitative relationship in atomic concentration between two or more substances in the phase change material in a volume measurable, for example, using energy dispersive x-ray spectroscopy (EDX), or equivalent techniques.

Figure 4A:
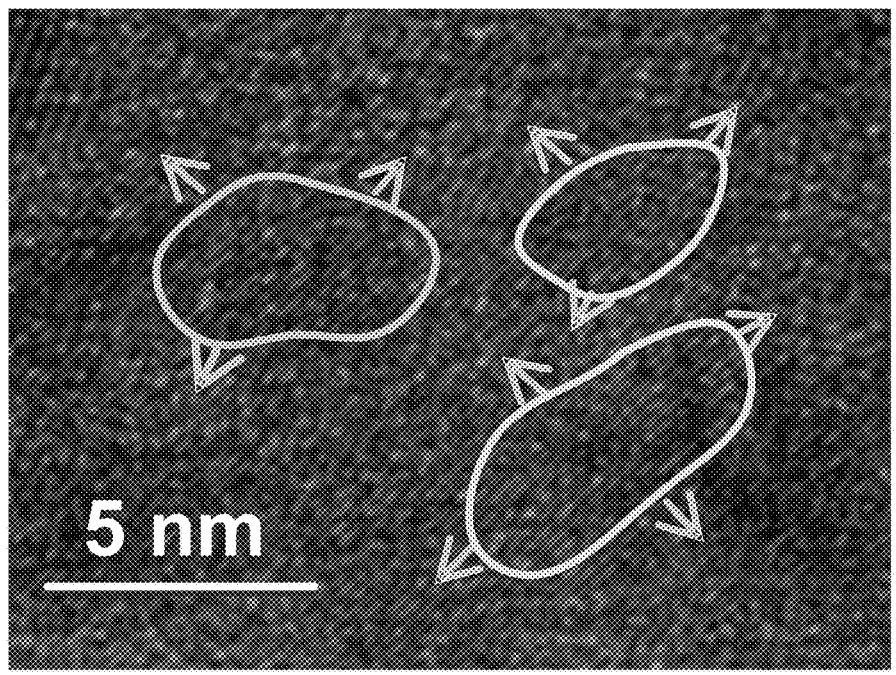
FIG. 4A is a high resolution transmission electron microscopy (HRTEM) image illustrating an expanded view of a conglomerate material having nanocrystalline grains as described herein in the reset state.
Figure 4B:
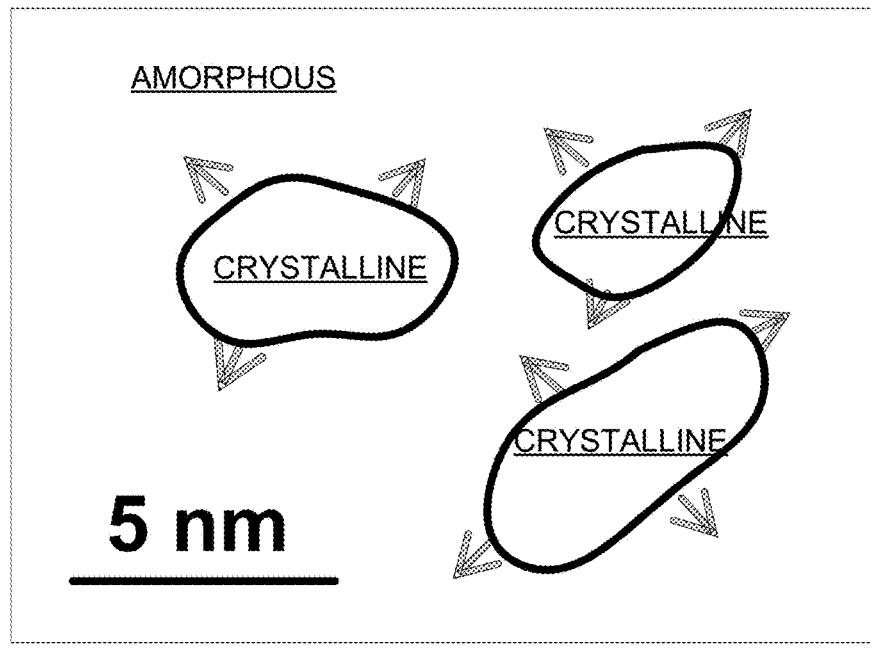
FIG. 4B indicates the marked regions in FIG. 4A as crystalline phase.

FIG. 4A is a high resolution transmission electron microscopy (HRTEM) image illustrating an expanded view of a conglomerate material having nanocrystalline grains as described herein, in the reset state. FIG. 4B indicates the marked regions in FIG. 4A as crystalline phase. The nanocrystalline grains are surrounded by the amorphous material so that the conglomerate material between the first and second electrodes is in the high resistance state. The grain size of the nanocrystalline grains is less than 10 nm in minimum dimension. The arrows indicate the directions of expansion of the nanocrystalline grains, if a set operation is executed, in which the nanocrystalline grains grow to contact each other to create low resistance.

Figure 5A:
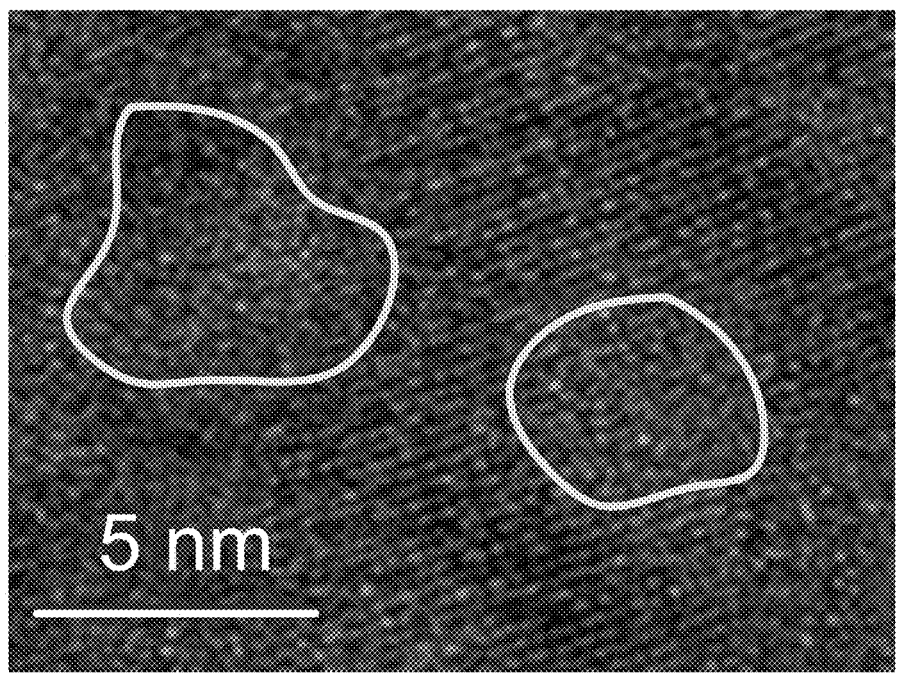
FIG. 5A is a high resolution transmission electron microscopy (HRTEM) image illustrating an expanded view of a conglomerate material having nanocrystalline grains as described herein in the set state.
Figure 5B:
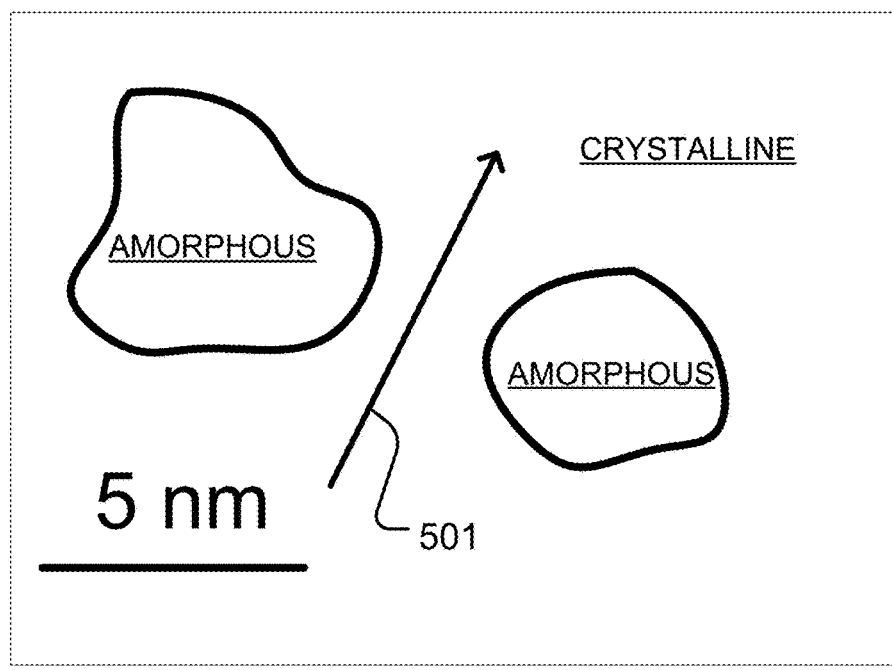
FIG. 5B indicates the marked regions in FIG. 5A as amorphous phase.

FIG. 5A is a high resolution transmission electron microscopy (HRTEM) image illustrating an expanded view of a conglomerate material having nanocrystalline grains as described herein, in the set state. FIG. 5B indicates the marked regions in FIG. 5A as amorphous phase. The amorphous regions are isolated by the crystalline material so that the conglomerate material between the first and second electrodes is in the low resistance state. The arrow 501 indicates a current path, if a reset operation is executed, in which the crystalline material between the amorphous regions will be amorphized to create high resistance.

Figure 1A:
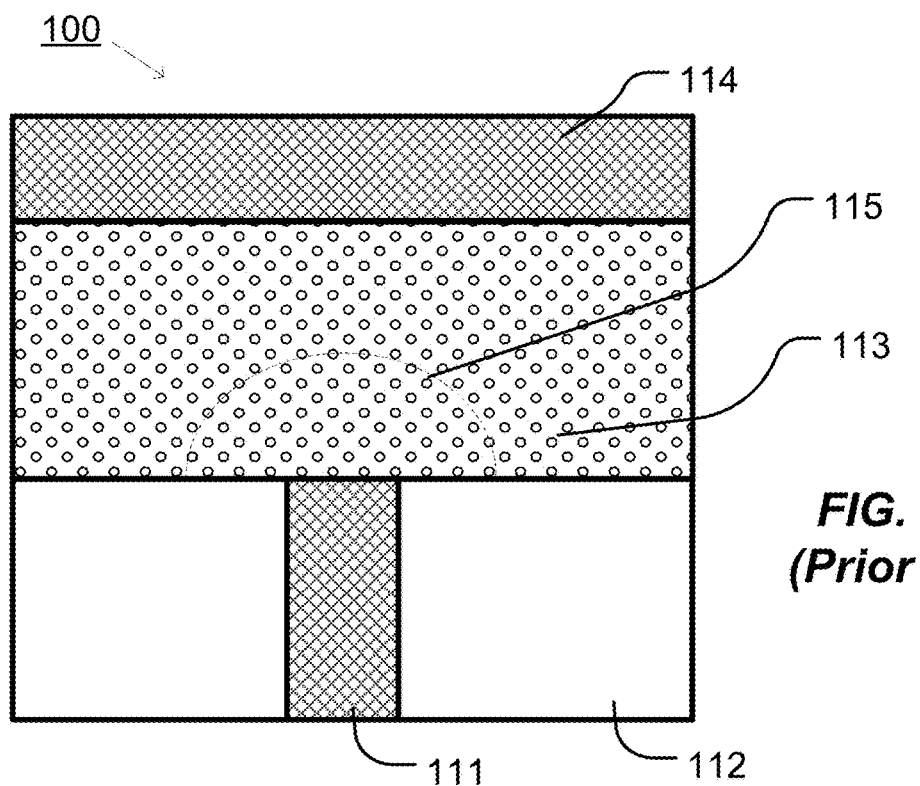
FIG. 1A illustrates a prior art "mushroom" type phase change memory cell.
Figure 1B:
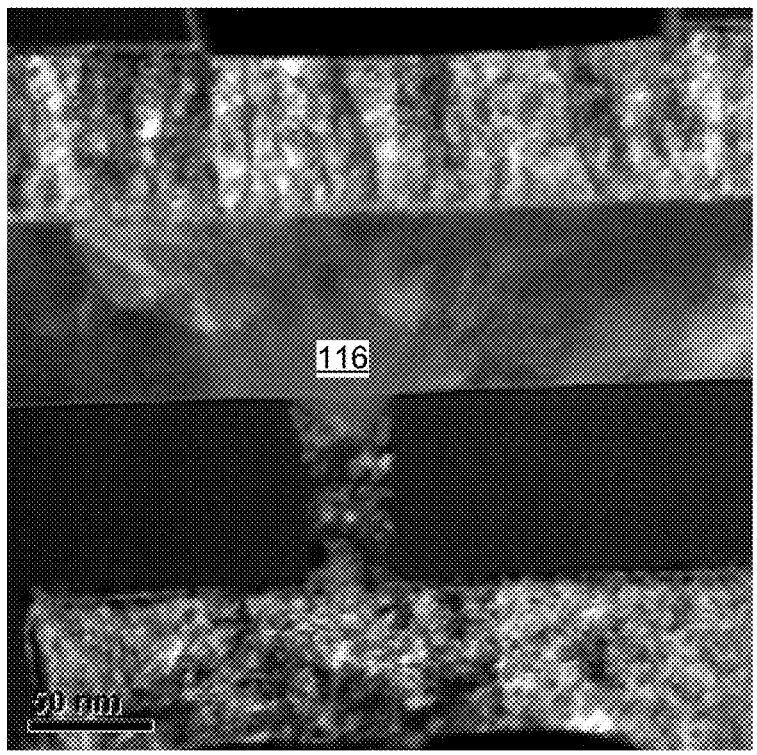
FIG. 1B is a low angle annular dark field scanning transmission electron microscopy (LAADF-STEM) image of a cross-section of a mushroom-type memory cell comprising $Ge_2Sb_2Te_5$ in the reset state.
Figure 6:
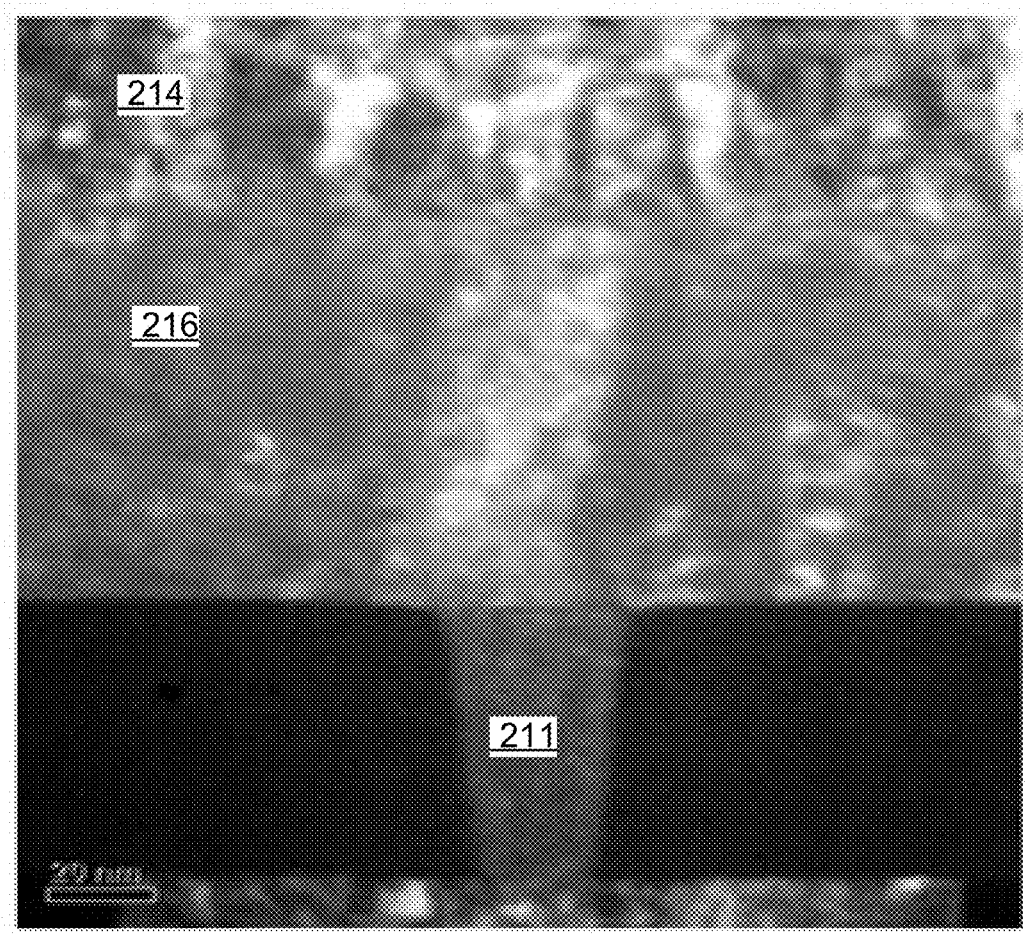
FIG. 6 is a low angle annular dark field scanning transmission electron microscopy (LAADF-STEM) image of a cross-section of a memory cell comprising a conglomerate material having nanocrystalline grains as described herein in the reset state.

FIG. 6 is a low angle annular dark field scanning transmission electron microscopy (LAADF-STEM) image of a cross-section of a memory cell comprising a conglomerate material having nanocrystalline grains in the reset state. As compared to FIG. 1A, FIG. 6 reveals no big amorphous mushroom-shaped region in the conglomerate material 216 above the first electrode 211. This is because the phase change region in the conglomerate material is limited to the space between the nanocrystalline grains. As no big bulk amorphous region needs to be formed in the conglomerate material, the reset current drastically decreases.

Figure 7:
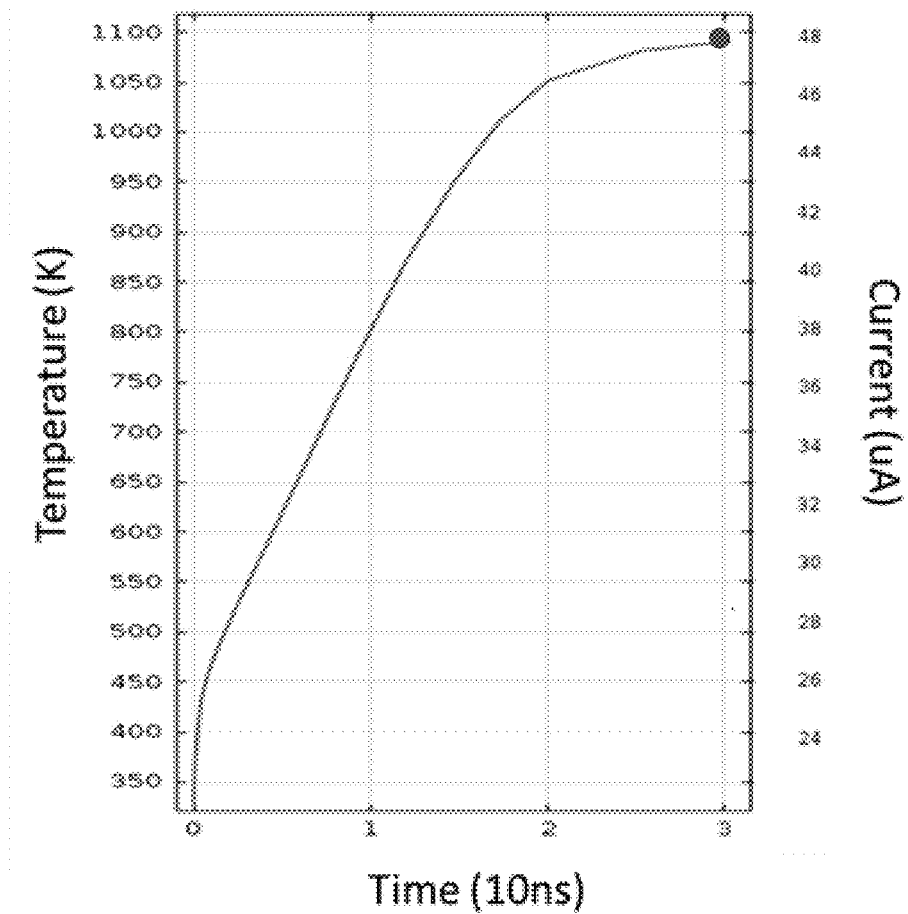
FIG. 7 is a graph illustrating the melting temperature and reset current as a function of time based on a simulation of a prior art mushroom-type memory cell.
Figure 8:
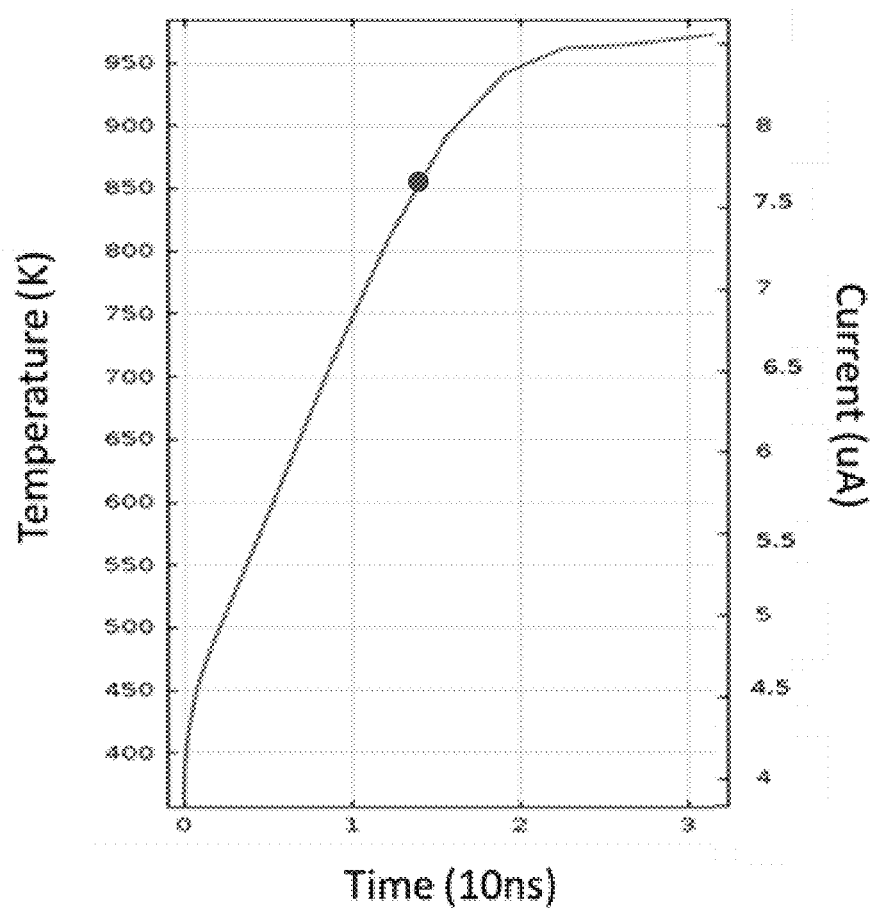
FIG. 8 is graph illustrating the melting temperature and reset current as a function of time based on a simulation of a memory cell comprising a conglomerate material having nanocrystalline grains as described herein.

FIG. 7 and FIG. 8 are simulation results that illustrate the melting temperature and reset current as a function of time for a prior art mushroom-type memory cell comprising $Ge_2Sb_2Te_5$ and for a memory cell comprising a conglomerate material, respectively. The hottest point in the mushroom-type memory cell is located in the center of the bulk amorphous region. When applying the reset current of 48 μA the center of the phase change region is heated up to 1100K as shown in FIG. 7. Due to the local current crowding effect in the conglomerate material, as seen in FIG. 8, the reset current needs only 7.5 μA to heat up to 850K and to form the amorphous phase between the nanocrystalline grains.

Figure 9:
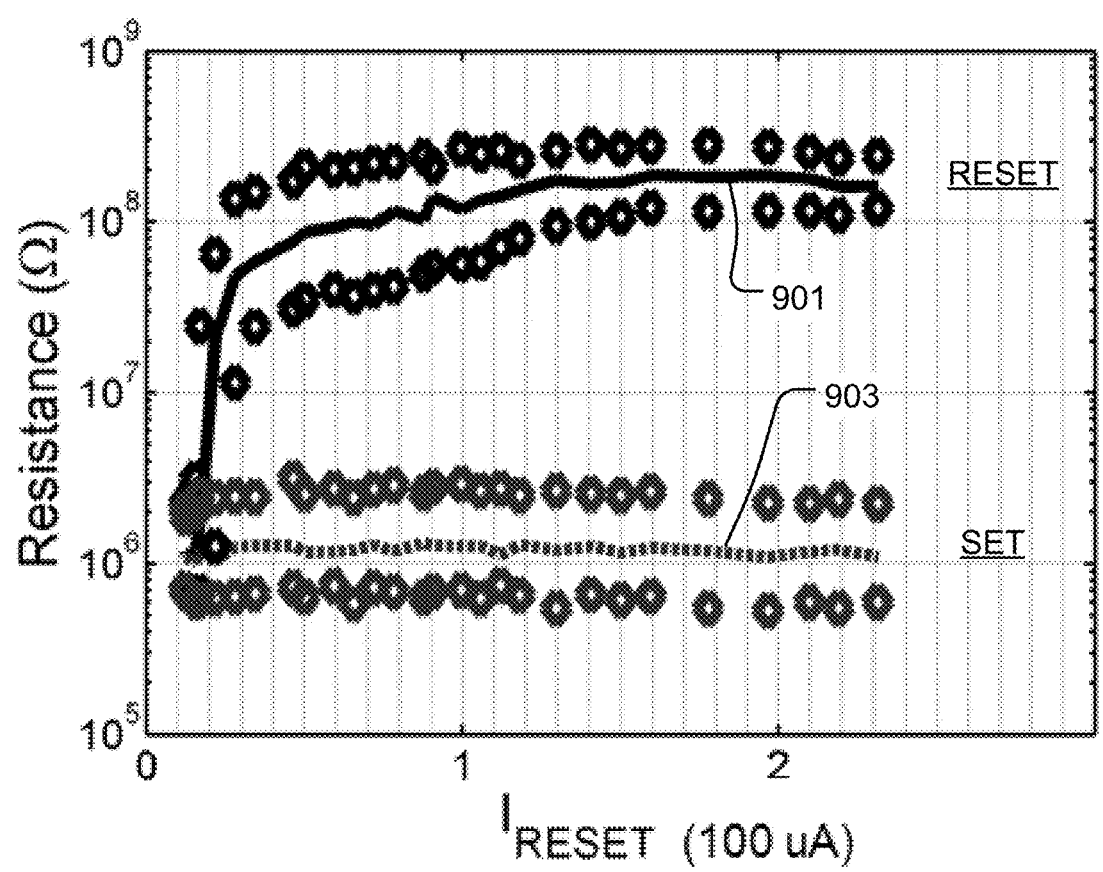
FIG. 9 is a graph illustrating resistance as a function of reset current of memory cells comprising a conglomerate material having nanocrystalline grains as described herein.
Figure 10:
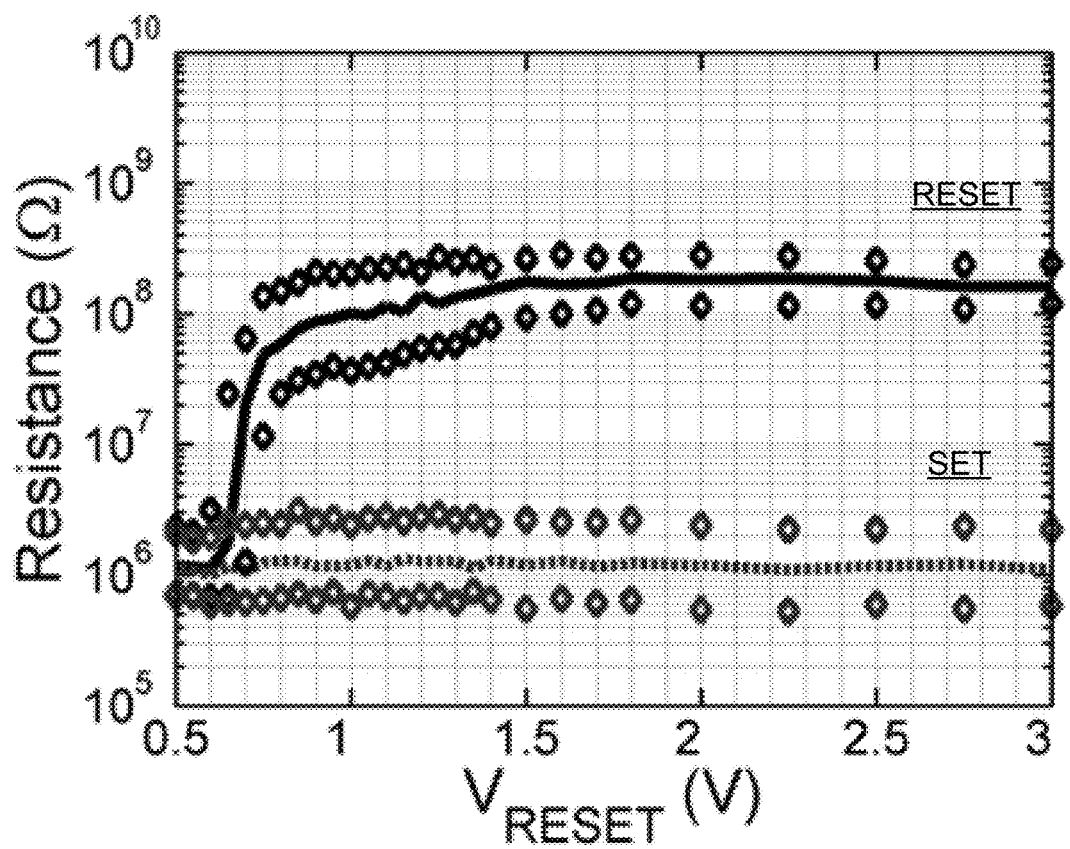
FIG. 10 is a graph illustrating resistance as a function of reset voltage of memory cells comprising a conglomerate material having nanocrystalline grains as described herein.

FIG. 9 is a graph illustrating resistance as a function of reset current of memory cells comprising a conglomerate material having nanocrystalline grains described herein. Curves 901 and 903 illustrate the average values of resistance in the reset and set states, respectively. With use of a ring type bottom electrode having diameter of 35 nm and thickness of 1.5 nm, the reset current needs only 20 μA to induce enough resistance difference, for example 10×, between the reset and set states. FIG. 10 illustrates resistance as a function of reset voltage, using the same memory cell structure used for the experiment producing FIG. 9. With application of about 1 volt bias to the gate and drain of the access transistor, the resulting reset current provides an operation window of 10× resistance difference.

Figure 11:
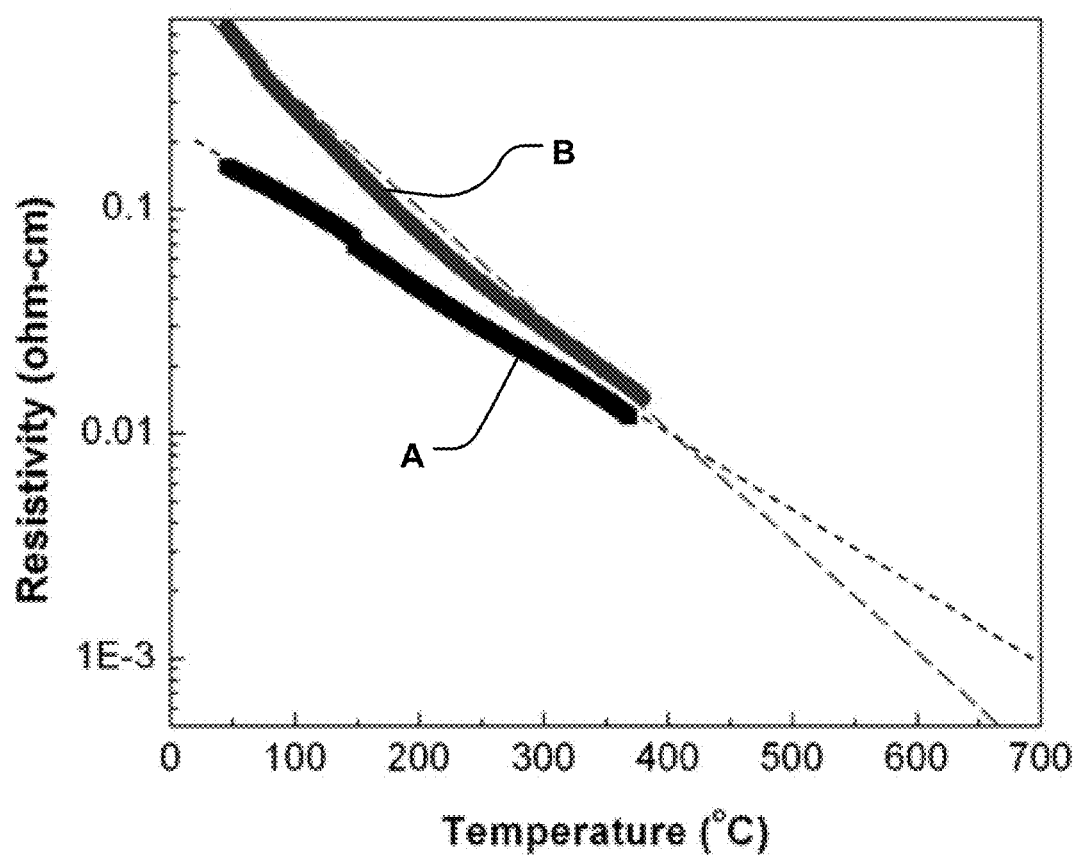
FIG. 11 is a graph illustrating the resistivity as a function of temperature of memory cells comprising conglomerate materials A and B.
Figure 12:
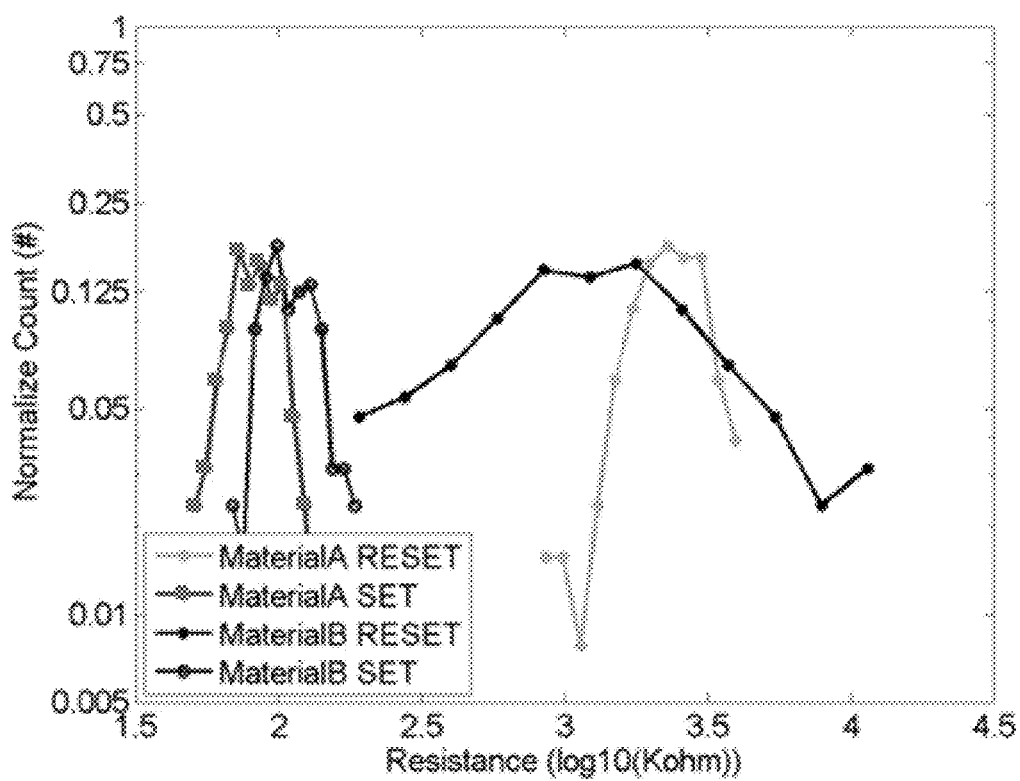
FIG. 12 is a graph illustrating the resistance distribution of memory cells comprising conglomerate materials A and B.

FIG. 11 is a graph of memory cells comprising conglomerate materials A and B, illustrating the resistivity as a function of temperature. At higher temperatures (above about 400° C.), material A exhibits greater resistance than material B, but at lower temperature (below about 400° C.), material A has lower resistance than material B. Due to the lower resistance at room temperature, material A may exhibit a faster read speed. FIG. 12 is a graph illustrating the resistance distribution of memory cells comprising conglomerate materials A and B. With the reset current of 80 µA applied to both materials A and B, material A has narrower distribution in the reset state.

Figure 13:
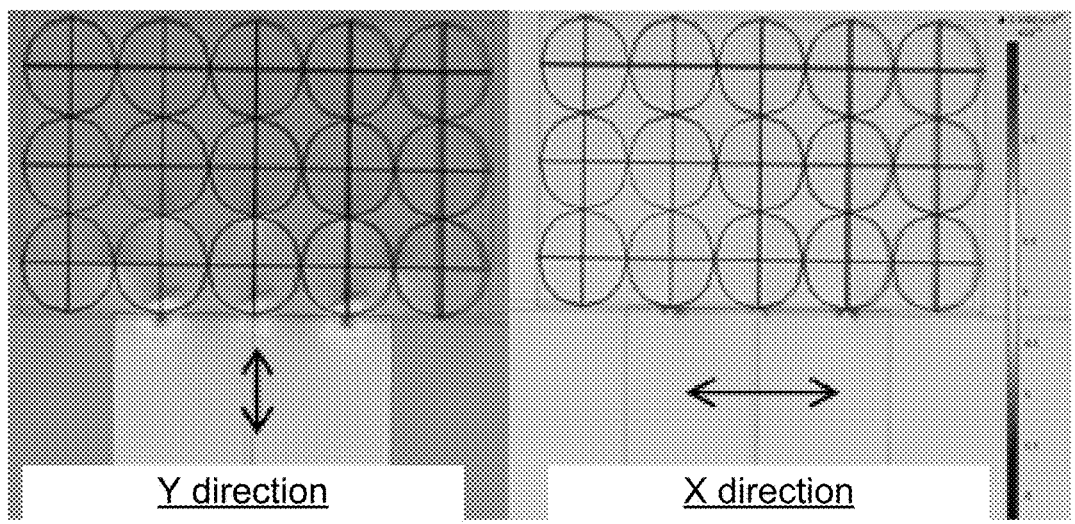
FIG. 13 illustrates heat flow simulation of a memory cell comprising a conglomerate material having nanocrystalline grains as described herein.
Figure 14:
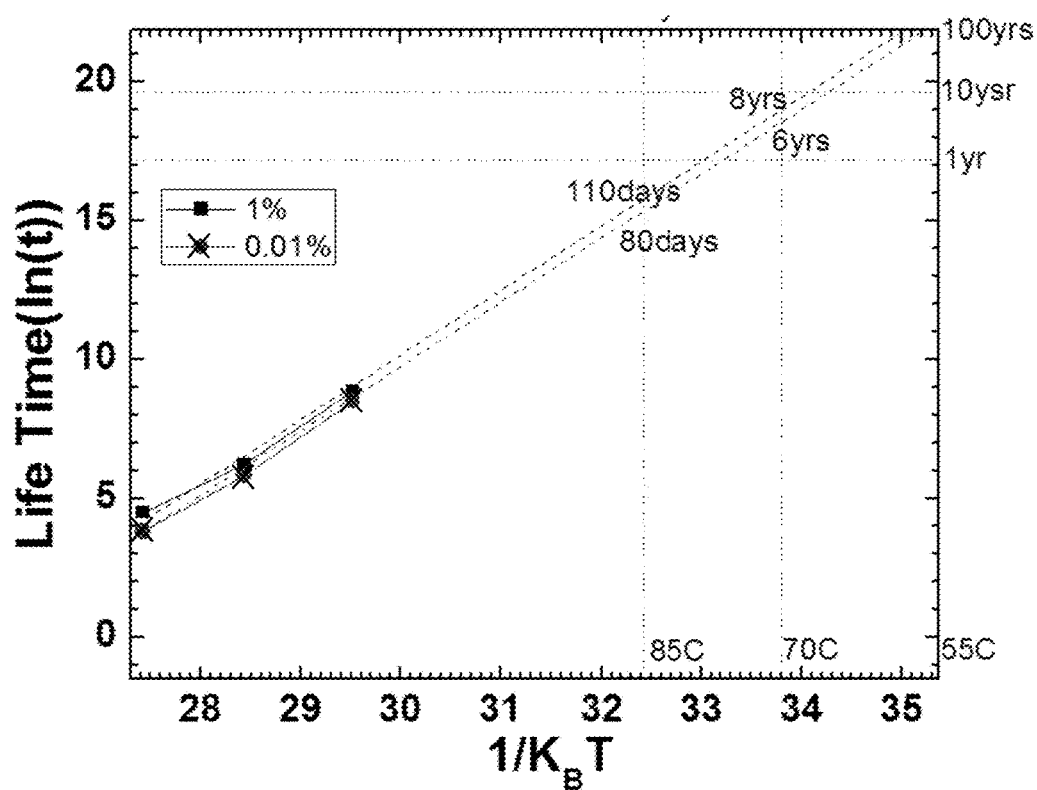
FIG. 14 is a graph illustrating improved endurance achieved by memory cells comprising a conglomerate material A as described herein.
Figure 15:
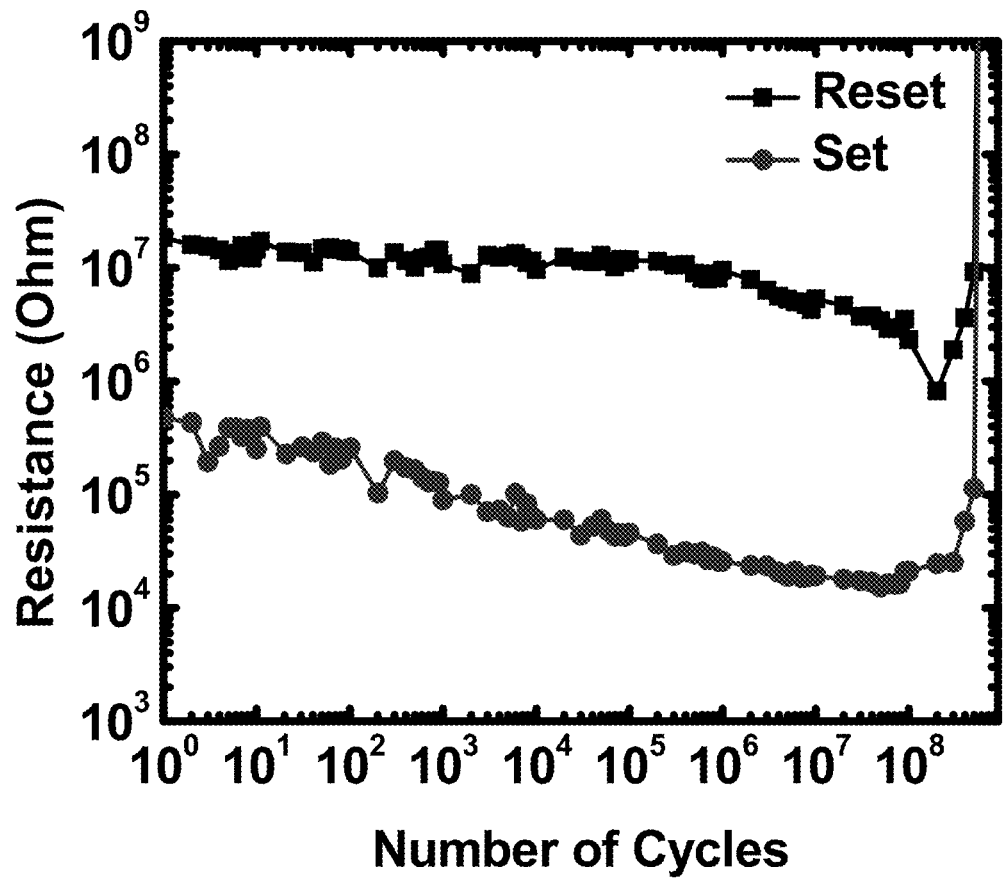
FIG. 15 is a graph illustrating improved number of cycles achieved by memory cells comprising a conglomerate material A as described herein.

FIG. 13 illustrates heat flow simulation of a memory cell comprising a conglomerate material having nanocrystalline grains. In the Y direction, heat generated between the nanocrystalline grains flows into the electrode, which minimizes the thermal disturbance to the neighboring cells in reset operation. The amorphous material surrounding the nanocrystalline grains takes a part in the thermal isolation to greatly reduce the disturbance in the X direction. FIG. 14 is a graph illustrating improved endurance achieved by memory cells comprising a conglomerate material A using a 256 Mb test chip. The nanocrystalline grains embedded in the amorphous matrix are inhibited from growth by the surrounding amorphous material so that the data retention is improved. As extrapolated in FIG. 14, material A may demonstrate good data retention of 55° C./100 years. FIG. 15 is a graph illustrating improved number of cycles achieved by memory cells comprising a conglomerate material A. Material A also can achieve the number of cycles of greater than $10^8$ and maintain an operation window of 10× resistance difference, as shown in FIG. 15.

Figure 16:
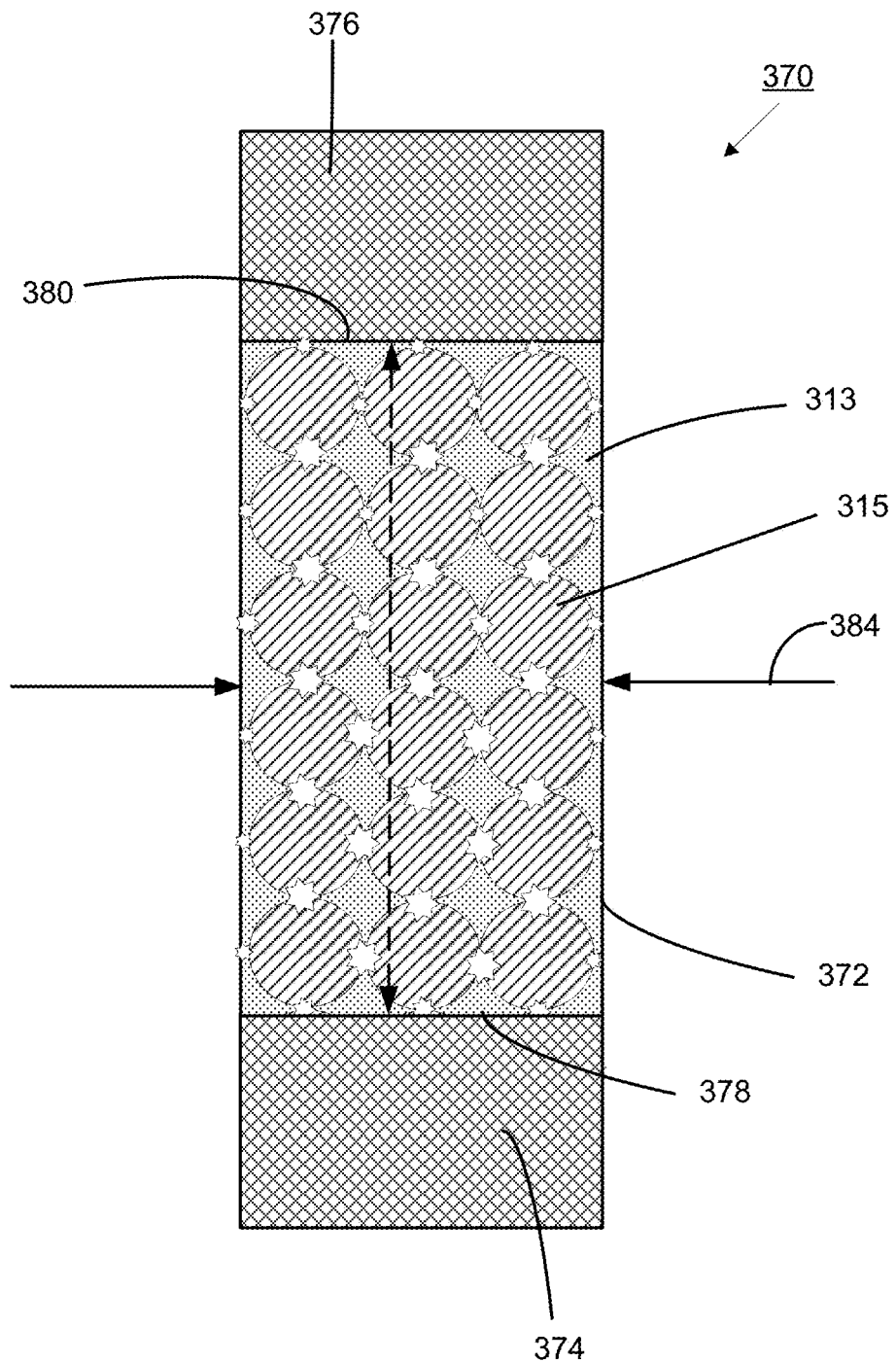
FIG. 16 illustrates a cross-sectional view of a thermally confined memory cell.

FIG. 16 illustrates a cross-sectional view of an alternative memory cell 370 design. Memory cell 370 includes a memory element 372 comprising the conglomerate material in an inter-electrode current path through memory element 372. The conglomerate material comprises nanocrystalline grains 315 embedded in an amorphous matrix 313. The memory element 372 is in a pillar shape and contacts first and second electrodes 374 and 376 at electrode surfaces 378 and 380, respectively. The memory element 372 has a width 384 substantially the same as that of the first and second electrodes 374 and 376 to define a multi-layer pillar surrounded by dielectric (not shown). As used herein, the term "substantially" is intended to accommodate manufacturing tolerances. In operation, as current passes between the first and second electrodes 374 and 376 and through the memory element 372, the inter-grain boundaries heats up to cause phase change reactions. This leads to a majority of the phase transformation occurring at the inter-grain boundaries within the conglomerate material during device operation.

Figure 17:
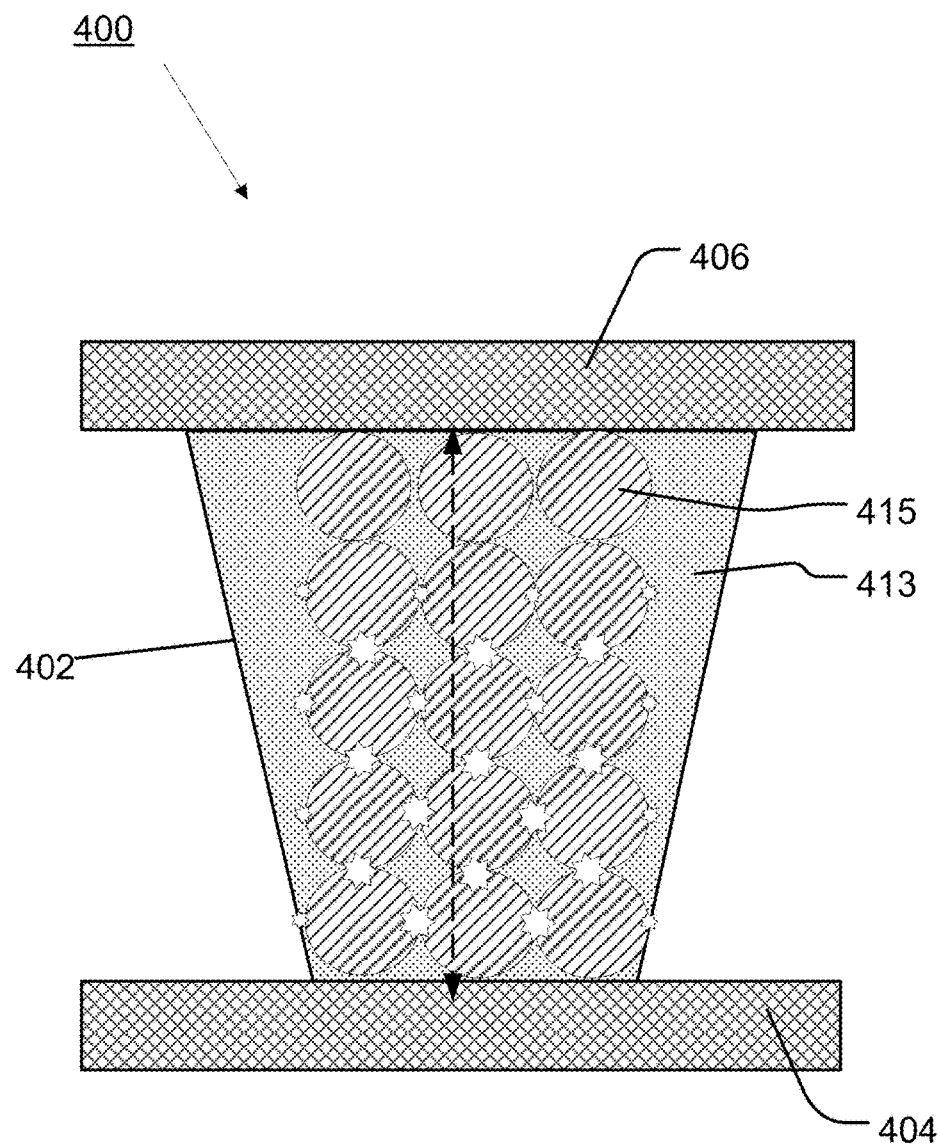
FIG. 17 illustrates a cross-sectional view of an alternative memory cell design.

FIG. 17 illustrates a cross-sectional view of an alternative memory cell 400 design. The memory cell 400 includes a memory element 402 comprising the conglomerate material including nanocrystalline grains 415 embedded in an amorphous matrix 413 in an inter-electrode current path through the memory element 402. The memory element 402 is surrounded by dielectric (not shown) contacting first and second electrodes 404 and 406 at electrode surfaces. The memory element 402 has a varying width that is always less than the width of the first and second electrodes. In operation, as current passes between the first and second electrodes 404 and 406 and through the memory element 402 the inter-grain boundaries heat up within the conglomerate material, thereby causing phase change reactions at the inter-grain boundaries. Thus the volume of inter-grain boundaries within the conglomerate material is where a majority of the phase transformation occurs during device operation.

As will be understood, the conglomerate material comprising a chalcogenide with an additive or additives, as described herein, can be used in a variety of memory cell structures and is not limited to the memory cell structures described herein.

Figure 18:
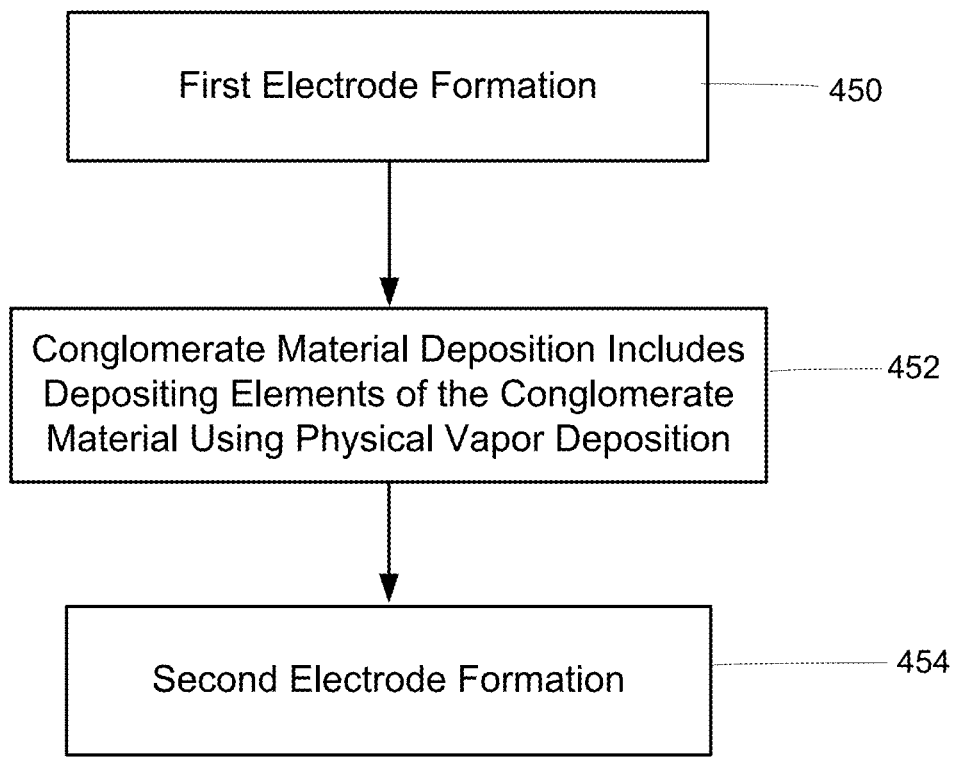
FIG. 18 illustrates a manufacturing process flow for manufacturing a memory cell of FIG. 2.

FIG. 18 illustrates a manufacturing process flow for manufacturing a memory cell including a conglomerate material with a structure of the memory cell shown in FIG. 2, wherein the conglomerate material has a first stoichiometry of the nanocrystalline grains and a second stoichiometry of the amorphous material in the amorphous matrix. Reference numerals used in the following description of the process of FIG. 18 are taken from FIG. 2. At step 450 the first electrode 211 having a width (or diameter) is formed extending through the dielectric layer (not shown). The first electrode 211 comprises TiN and the dielectric layer comprises SiN. Alternatively the first electrode 211 can have a sublithographic width (or diameter).

The first electrode 211 is connected to a connector extending through the dielectric layer to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode 211 and the dielectric layer can be formed, for example, using methods, materials, and processes as disclosed in co-owned U.S. Pat. No. 8,138,028, which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode 211. Next, the mask of photoresist is formed overlying the location of the first electrode 211. Then the layer of electrode material is etched using the mask of photoresist. Next, dielectric material is formed and planarized.

At step 452 a conglomerate material is formed using physical vapor deposition in a sputtering system. The sputtering system includes a chamber in which a sputter target having an overdosed element of additive and a substrate are mounted. The term "overdosed" used herein refers to the amount of the additive in the sputter target is greater than that in the conglomerate material. For example, to form the conglomerate material with 5% of an additive, the sputter target may have 20% of element of that additive. Also, the chamber is configured with a gas source of the reaction gas, such as oxygen or nitrogen for use in causing addition of other components in the conglomerate material. The conglomerate material is formed including nanocrystalline grains 215 (less than 10 nm in the minimum dimension) embedded in an amorphous matrix 213. The conglomerate material comprises a chalcogenide with an amount of germanium effective to cause the conglomerate material to form the nanocrystalline grains 215 in the amorphous matrix 213. Also, the conglomerate material comprises a chalcogenide with one or more additives selected from a group including silicon, oxygen, nitrogen and carbon, in an amount or amounts effective to cause the conglomerate material to form the nanocrystalline grains 215 in the amorphous matrix 213.

Next, at step 454 a second electrode 214 is formed on the conglomerate material.

Figure 19:
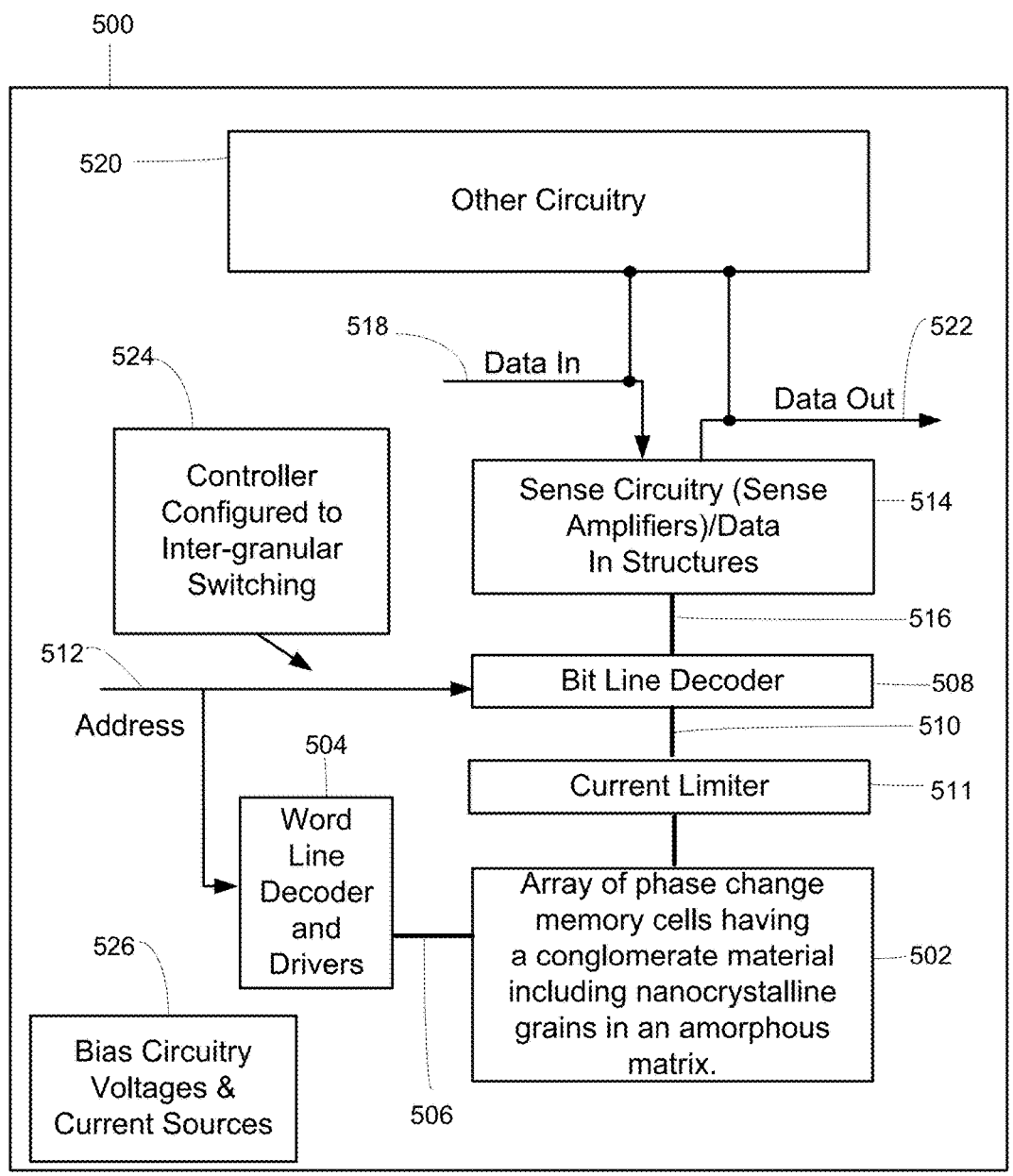
FIG. 19 is a simplified block diagram of an integrated circuit including a memory array having memory cells with memory elements comprising a conglomerate material as described herein.

FIG. 19 is a simplified block diagram of an integrated circuit 500 including a memory array 502 having memory cells with memory elements comprised of a conglomerate material. A word line decoder at 504 having read, set and reset modes is coupled to and in electrical communication with a plurality of word lines 506 arranged along rows in the memory array 502. A bit line (column) decoder 508 is in electrical communication with a plurality of bit lines 510 arranged along columns in the array 502 for reading, setting, and resetting the phase change memory cells (not shown) in array 502. A current limiter 511, which is optional, is coupled to the bit lines in this example, which is controlled by the controller 524 during the reset operation, during the set operation, or during both operations as described above. A current limiter can comprise a controlled current resource or a variable resistance element, for example. Addresses are supplied on bus 512 to word line decoder and drivers 504 and bit line decoder 508. Sense circuitry (Sense amplifiers) and data-in structures in block 514, including voltage and/or current sources for the read, set, and reset modes are coupled to bit line decoder 508 via data bus 516. Data is supplied via a data-in line 518 from input/output ports on integrated circuit 500, or from other data sources internal or external to integrated circuit 500, to data-in structures in block 514. Other circuitry 520 may be included on integrated circuit 500, such as a general purpose processor or special purpose application circuitry, or a combination of modules providing system-on-a-chip functionality supported by array 502. Data is supplied via a data-out line 522 from the sense amplifiers in block 514 to input/output ports on integrated circuit 500, or to other data destinations internal or external to integrated circuit 500.

A controller 524 implemented in this example, using a bias arrangement state machine, controls the application of bias circuitry voltage and current sources 526 for the application of bias arrangements including read, program, erase, erase verify and program verify voltages and/or currents for the word lines and bit lines. In another embodiment, bias circuitry may include a current limiter instead of, or in addition to the current limiter 511, so as to limit the magnitude of the reset current, without melting or otherwise eliminating the nanocrystalline grains in the conglomerate material and to limit the magnitude of the set current to crystallization and elimination of the bodies of amorphous material between the nanocrystalline grains. In addition, bias arrangements for melting/cooling cycling may be implemented. Controller 524 may be implemented using special-purpose logic circuitry as known in the art. In alternative embodiments, controller 524 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 524.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
   a first electrode having an electrode surface;
   a conglomerate material on the electrode surface, the conglomerate material including nanocrystalline grains embedded in an amorphous matrix;
   a second electrode on the conglomerate material; and
   circuitry to apply a first bias arrangement to induce formation of amorphous material between the nanocrystalline grains within a region over the electrode surface, effective to increase electrical resistance of the conglomerate material between the first and second electrodes above a first threshold without eliminating nanocrystalline grains in the region, and to apply a second bias arrangement to induce expansion of the nanocrystalline grains in the region by an amount effective to decrease electrical resistance of the conglomerate material between the first and second electrodes below a second threshold.

2. The device of claim 1, wherein the conglomerate material is composed of a phase change material.

3. The device of claim 1, wherein the conglomerate material is composed of a phase change material and an additive.

4. The device of claim 1, wherein after the first bias arrangement is applied the amorphous material surrounds the nanocrystalline grains, and after the second bias arrangement is applied the nanocrystalline grains surround the amorphous material.

5. The device of claim 1, wherein the conglomerate material comprises a chalcogenide with an amount of germanium effective to cause the conglomerate material to form the nanocrystalline grains in the amorphous matrix.

6. The device of claim 5, wherein the chalcogenide comprises $Ge_xSb_yTe_z$.

7. The device of claim 1, wherein the conglomerate material comprises a chalcogenide with one or more additives selected from a group including silicon, oxygen, nitrogen and carbon, in an amount or amounts effective to cause the conglomerate material to form the nanocrystalline grains in the amorphous matrix.

8. The device of claim 1, further including a current limiter to limit current flow through the conglomerate material during the first bias arrangement.

9. A method for operating a memory device having a memory element comprising a conglomerate material including nanocrystalline grains embedded in an amorphous matrix disposed between first and second electrodes, the method comprising:
   to store a first data value, applying a first bias arrangement to induce formation of amorphous material between the nanocrystalline grains within a region over the first electrode, by an amount effective to increase electrical resistance of the conglomerate material between the first and second electrodes above a first threshold without eliminating nanocrystalline grains in the region; and
   to store a second data value, applying a second bias arrangement to induce expansion of the nanocrystalline grains within the region by an amount effective to decrease electrical resistance of the conglomerate material between the first and second electrodes below a second threshold.

10. The method of claim 9, including using a current limiter during the first bias arrangement to limit current flow through the memory element.

11. A method for manufacturing a memory device, comprising:
forming a first electrode having an electrode surface;
forming a conglomerate material on the electrode surface, the conglomerate material including nanocrystalline grains embedded in an amorphous matrix;
forming a second electrode on the conglomerate material; and
forming circuitry to apply a first bias arrangement to induce formation of amorphous material between the nanocrystalline grains within a region over the electrode surface, effective to increase electrical resistance of the conglomerate material between the first and second electrodes above a first threshold without eliminating nanocrystalline grains in the region, and to apply a second bias arrangement to induce expansion of the nanocrystalline grains in the region by an amount effective to decrease electrical resistance of the conglomerate material between the first and second electrodes below a second threshold.

12. The method of claim 11, wherein the conglomerate material is composed of a phase change material.

13. The method of claim 11, wherein the conglomerate material is composed of a phase change material and an additive.

14. The method of claim 11, wherein said forming a conglomerate material includes depositing elements of the conglomerate material using physical vapor deposition.

15. The method of claim 11, wherein the conglomerate material comprises a chalcogenide with one or more additives selected from a group including silicon, oxygen, nitrogen and carbon.

16. The method of claim 11, wherein the conglomerate material comprises a chalcogenide with an amount of germanium effective to cause the conglomerate material to form the nanocrystalline grains in the amorphous matrix.

17. The method of claim 16, wherein the chalcogenide comprises $Ge_xSb_yTe_z$.

18. The method of claim 11, wherein the conglomerate material comprises a chalcogenide with one or more additives selected from a group including silicon, oxygen, nitrogen and carbon, in an amount or amounts effective to cause the conglomerate to form the nanocrystalline grains in the amorphous matrix.

* * * * *